(12) United States Patent
More et al.

(10) Patent No.: US 12,166,041 B2
(45) Date of Patent: Dec. 10, 2024

(54) SEMICONDUCTOR DEVICE AND METHOD

(71) Applicant: Taiwan Semiconductor Manufacturing Co., Ltd., Hsinchu (TW)

(72) Inventors: Shahaji B. More, Hsinchu (TW); Chandrashekhar Prakash Savant, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/362,749

(22) Filed: Jul. 31, 2023

(65) Prior Publication Data

US 2024/0021617 A1 Jan. 18, 2024

Related U.S. Application Data

(62) Division of application No. 17/211,109, filed on Mar. 24, 2021, now Pat. No. 11,862,638.

(60) Provisional application No. 63/082,530, filed on Sep. 24, 2020, provisional application No. 63/065,557, filed on Aug. 14, 2020.

(51) Int. Cl.
*H01L 27/092* (2006.01)
*H01L 21/8234* (2006.01)
*H01L 29/66* (2006.01)
*H01L 29/78* (2006.01)

(52) U.S. Cl.
CPC .. *H01L 27/0924* (2013.01); *H01L 21/823412* (2013.01); *H01L 21/823431* (2013.01); *H01L 21/823468* (2013.01); *H01L 29/6656* (2013.01); *H01L 29/6681* (2013.01); *H01L 29/7851* (2013.01)

(58) Field of Classification Search
CPC ......... H01L 27/0924; H01L 21/823412; H01L 21/823431; H01L 21/823468; H01L 29/6656; H01L 29/6681; H01L 29/7851
See application file for complete search history.

(56) References Cited

U.S. PATENT DOCUMENTS

| | | | |
|---|---|---|---|
| 9,799,649 B2 | 10/2017 | Chang et al. | |
| 2012/0264284 A1 | 10/2012 | Wang et al. | |
| 2014/0346607 A1 | 11/2014 | Ching et al. | |
| 2015/0236159 A1* | 8/2015 | He | H01L 21/31122 438/157 |
| 2016/0099337 A1 | 4/2016 | Cheng et al. | |
| 2016/0329415 A1* | 11/2016 | He | H01L 21/02274 |

(Continued)

FOREIGN PATENT DOCUMENTS

CN 106972054 A 7/2017

*Primary Examiner* — Christine A Enad
(74) *Attorney, Agent, or Firm* — Slater Matsil, LLP

(57) ABSTRACT

In an embodiment, a device includes: a first fin extending from a substrate; a second fin extending from the substrate; a gate spacer over the first fin and the second fin; a gate dielectric having a first portion, a second portion, and a third portion, the first portion extending along a first sidewall of the first fin, the second portion extending along a second sidewall of the second fin, the third portion extending along a third sidewall of the gate spacer, the third portion and the first portion forming a first acute angle, the third portion and the second portion forming a second acute angle; and a gate electrode on the gate dielectric.

20 Claims, 25 Drawing Sheets

(56) References Cited

U.S. PATENT DOCUMENTS

2017/0288032 A1\* 10/2017 Lu .................... H01L 21/31111
2020/0006075 A1   1/2020 Wang et al.
2020/0058790 A1   2/2020 Chiang et al.

\* cited by examiner

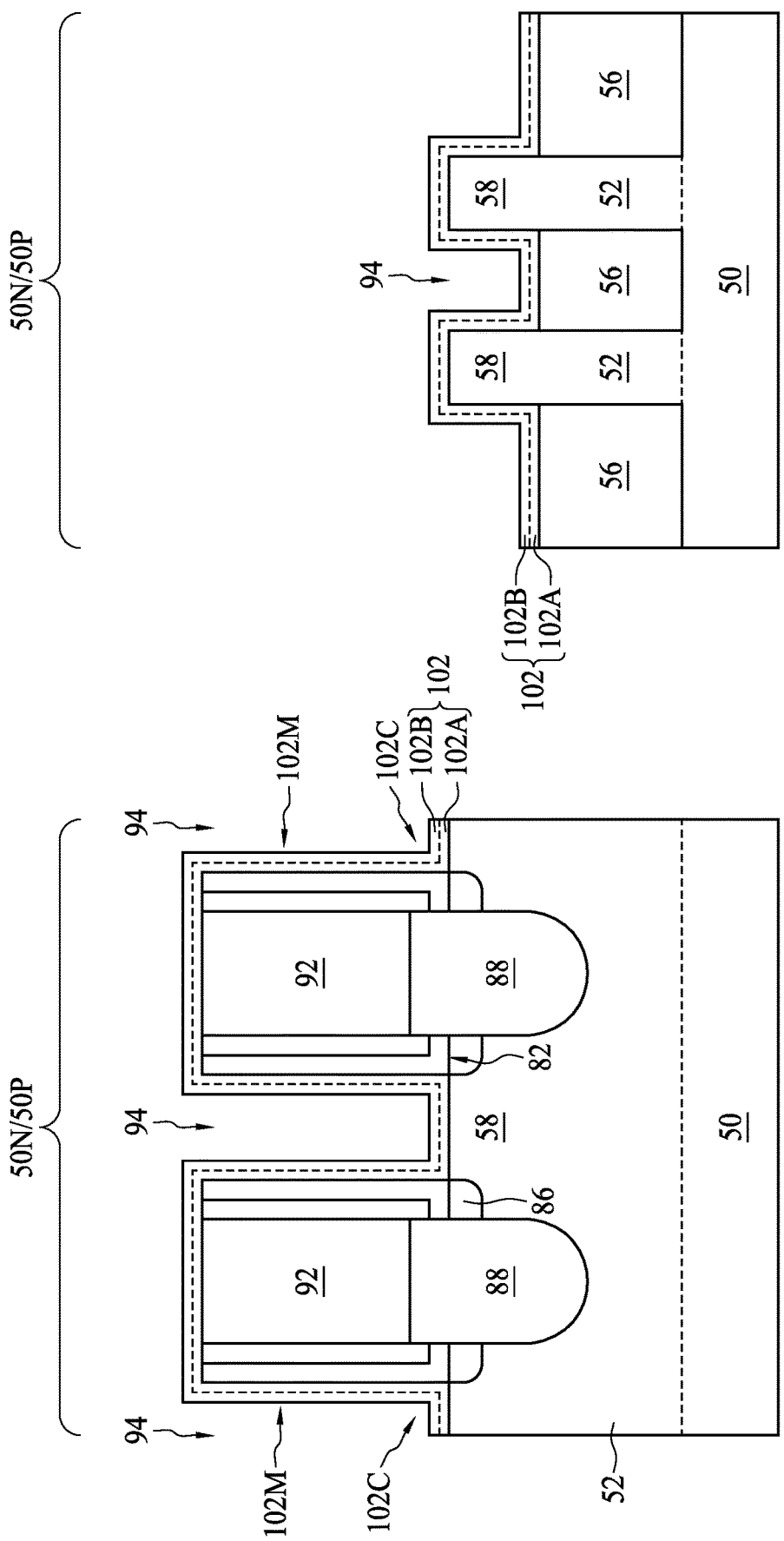

SEMICONDUCTOR DEVICE AND METHOD

PRIORITY CLAIM AND CROSS-REFERENCE

This application is a divisional of U.S. patent application Ser. No. 17/211,109, filed on Mar. 24, 2021, entitled "Semiconductor Device and Method," which claims the benefit of U.S. Provisional Application No. 63/082,530, filed on Sep. 24, 2020, and U.S. Provisional Application No. 63/065,557, filed on Aug. 14, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
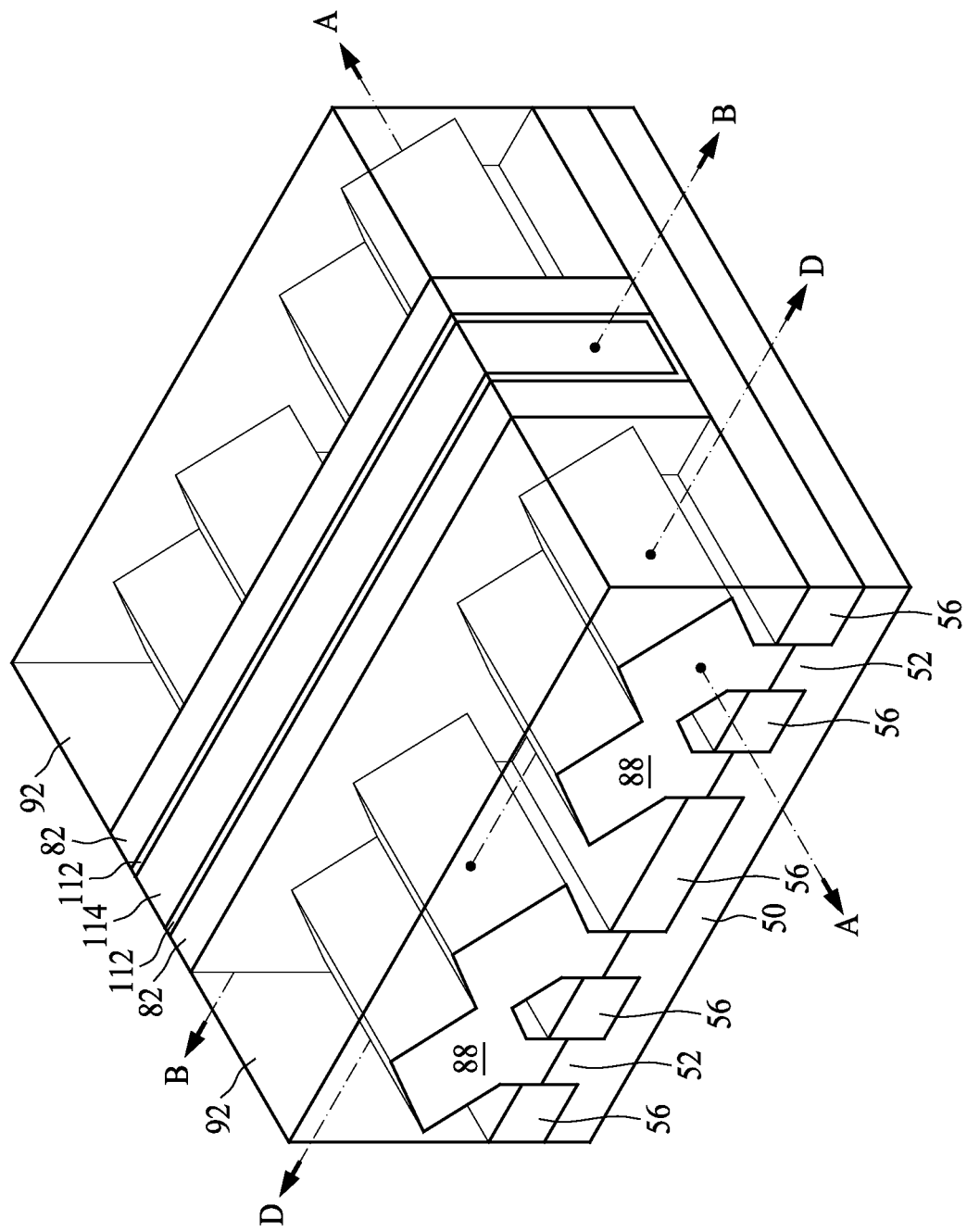
FIG. 1 illustrates an example of a FinFET in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, dummy gates are recessed and a spacer treatment process is performed on gate spacers that extend along sidewalls of the dummy gates. The spacer treatment process causes the gate spacers to bow in a top-down view. The dummy gates are then removed and replaced with metal gates. Increasing the bowing of the gate spacers may allow the materials of the metal gates to be more fully deposited. The formations of gaps or voids around the metal gates may be avoided, decreasing the gate resistance ($R_g$) of the FinFETs.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs include fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may include a single material or a plurality of materials. In this context, the fins 52 refer to the portions extending between the neighboring STI regions 56.

Gate dielectrics 112 are along sidewalls and over top surfaces of the fins 52, and gate electrodes 114 are over the gate dielectrics 112. Source/drain regions 88 are disposed in opposite sides of the fin 52 with respect to the gate dielectrics 112 and gate electrodes 114. Gate spacers 82 separate the source/drain regions 88 from the gate dielectrics 112 and gate electrodes 114. An inter-layer dielectric (ILD) 92 is disposed over the source/drain regions 88 and STI regions 56. In embodiments where multiple transistors are formed, the source/drain regions 88 may be shared between various transistors. In embodiments where one transistor is formed from multiple fins 52, neighboring source/drain regions 88 may be electrically connected, such as through merging the source/drain regions 88 by epitaxial growth, or through coupling the source/drain regions 88 with a same source/drain contact.

FIG. 1 further illustrates several reference cross-sections. Cross-section A-A and is along a longitudinal axis of a fin 52 and in a direction of, for example, a current flow between the source/drain regions 88 of the FinFETs. Cross-section B-B is perpendicular to cross-section A-A and is along a longitudinal axis of a gate electrode 114 and in a direction, for example, perpendicular to the direction of current flow between the source/drain regions 88 of the FinFETs. Cross-section D-D is parallel to cross-section B-B and extends through the source/drain regions 88 of the FinFETs. Subsequent figures refer to these reference cross-sections for clarity.

Figure 2:
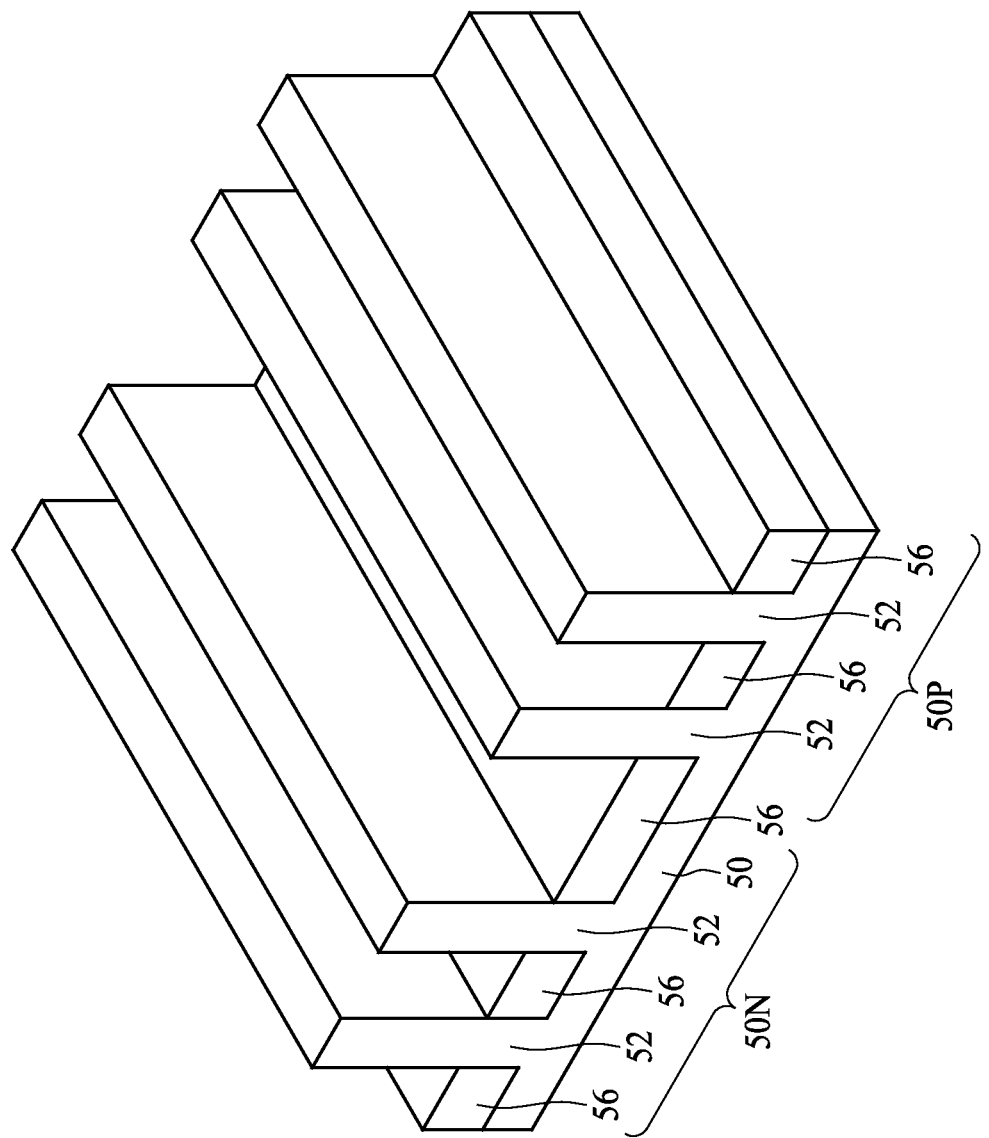
FIGS. 2 through 19B are various views of intermediate stages in the manufacturing of FinFETs, in accordance with some embodiments.
Figure 3:
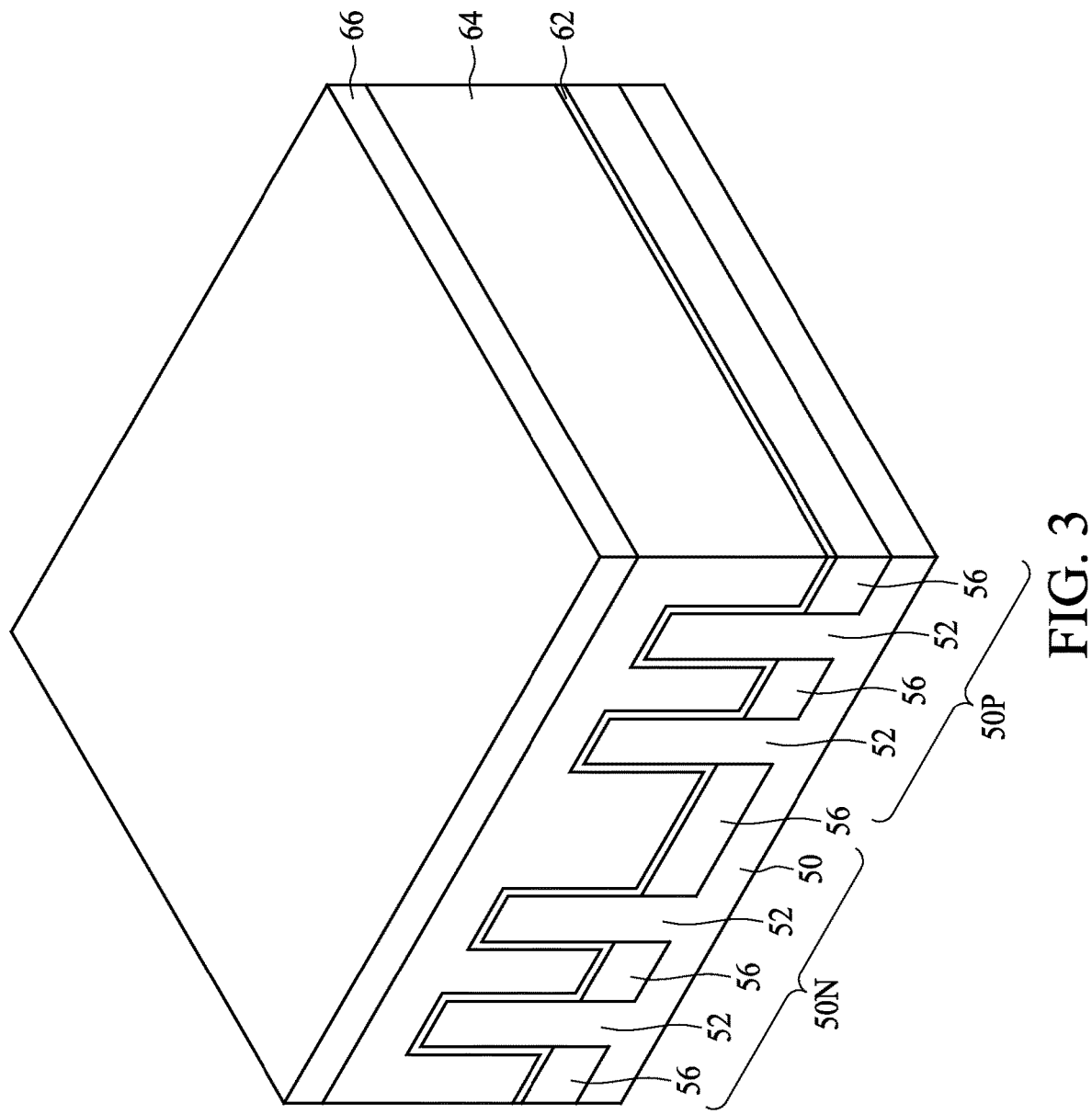

FIGS. 2 through 19B are various views of intermediate stages in the manufacturing of FinFETs, in accordance with some embodiments. FIGS. 2 and 3 are three-dimensional views. FIGS. 6A, 7A, 8A, 9A, 10A, 11A, 12A, 13A, 14A, 15A, 16A, 16D, 17A, 18A, and 19A are cross-sectional views illustrated along reference cross-section A-A in FIG. 1, except three gate structures are shown. FIGS. 6B, 7B, 8B, 9B, 10B, 11B, 12B, 13B, 14B, 15B, 16B, 17B, 18B, and 19B are cross-sectional views illustrated along reference cross-section B-B in FIG. 1, except only two fins 52 are shown. FIGS. 7C and 7D are cross-sectional views illustrated along reference cross-section D-D in FIG. 1, except only two fins 52 are shown In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P, and any number of device features (e.g., other active devices, doped regions, isolation structures, etc.) may be disposed between the n-type region 50N and the p-type region 50P.

Fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

STI regions 56 are formed over the substrate 50 and between neighboring fins 52. As an example to form the STI regions 56, an insulation material can be formed over the substrate 50 and between neighboring fins 52. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the fins 52. Although the STI regions 56 are illustrated as a single layer, some embodiments may utilize multiple layers. For example, in some embodiments a liner (not shown) may first be formed along a surface of the substrate 50 and the fins 52. Thereafter, a fill material, such as those discussed above, may be formed over the liner. A removal process is then applied to the insulation material to remove excess insulation material over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material are coplanar (within process variations) after the planarization process is complete. In embodiments in which a mask remains on the fins 52, the planarization process may expose the mask or remove the mask such that top surfaces of the mask or the fins 52, respectively, and the insulation material are coplanar (within process variations) after the planarization process is complete. The insulation material is recessed to form the STI regions 56. The insulation material is then recessed such that upper portions of the fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, an oxide removal using, for example, dilute hydrofluoric (dHF) acid may be used The process described with respect to FIG. 2 is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 can be recessed, and a material different from the fins 52 may be epitaxially grown over the recessed material. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., a NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not shown) may be formed in the fins 52 and/or the substrate 50. In some embodiments, a p-type well may be formed in the n-type region 50N, and a n-type well may be formed in the p-type region 50P. In some embodiments, p-type well or a n-type well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, a n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than about $10^{18}$ cm$^{-3}$, such as in the range of about $10^{16}$ cm$^{-3}$ to about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as in the range of about $10^{16}$ cm$^{-3}$ to about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 3, a dummy dielectric layer 62 is formed on the fins 52. The dummy dielectric layer 62 may be, for example, silicon oxide, silicon nitride, a combination thereof, or the like, and may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 64 may be deposited by physical vapor deposition (PVD), CVD, sputter deposition, or other techniques for depositing the selected material. The dummy gate layer 64 may be made of other materials that have a high etching selectivity from the etching of isolation regions, e.g., the STI regions 56 and/or the dummy dielectric layer 62. The mask layer 66 may include one or more layers of, for example, silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the STI regions 56, extending over the STI regions 56 and between the dummy gate layer 64 and the STI regions 56. In another embodiment, the dummy dielectric layer 62 covers only the fins 52.

Figure 4:
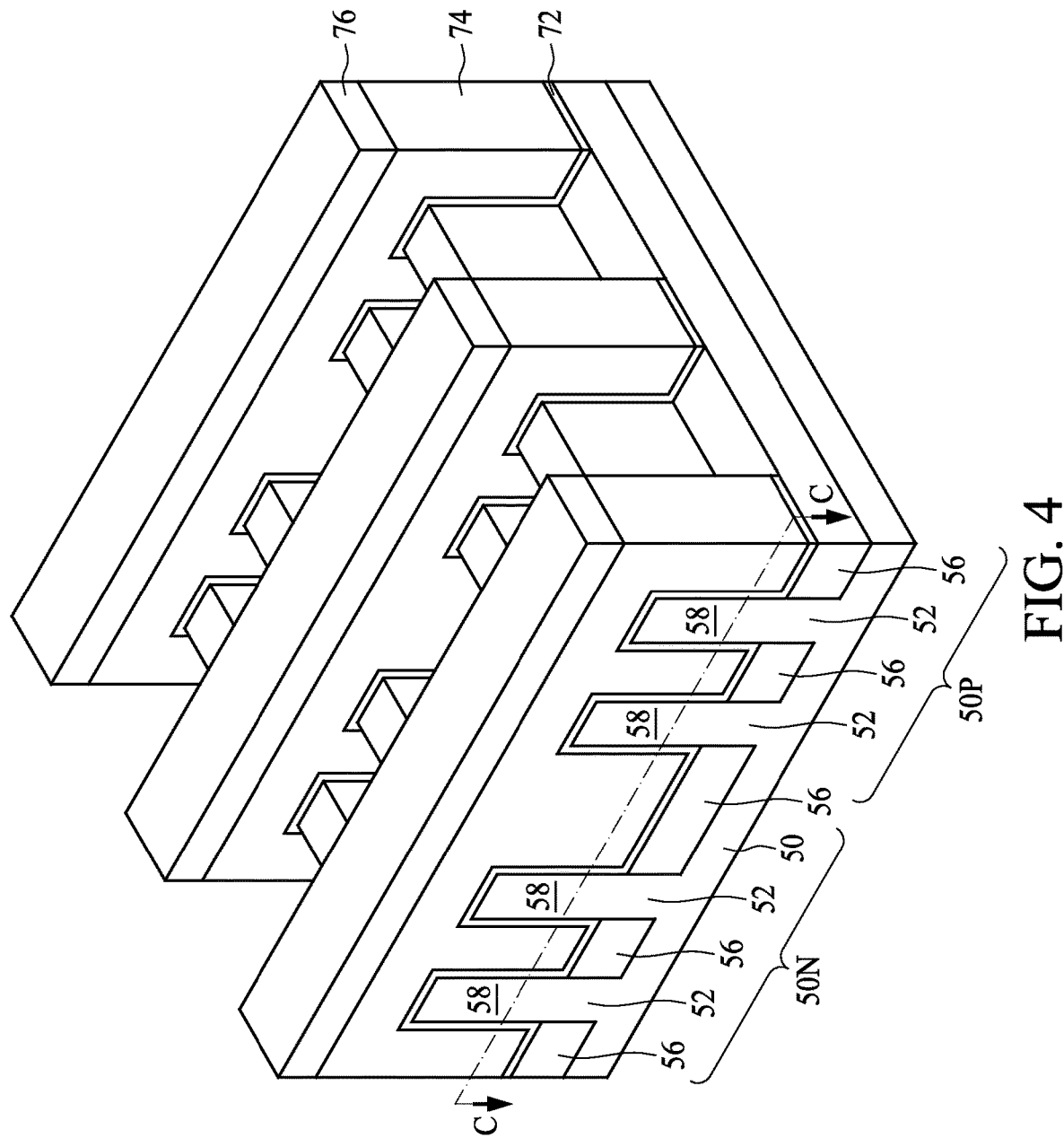

In FIG. 4, the mask layer 66 may be patterned using acceptable photolithography and etching techniques to form masks 76. The pattern of the masks 76 then may be transferred to the dummy gate layer 64 to form dummy gates 74. In some embodiments, the pattern of the masks 76 is also transferred to the dummy dielectric layer 62 by an acceptable etching technique to form dummy dielectrics 72. The dummy gates 74 cover respective channel regions 58 of the fins 52. The pattern of the masks 76 may be used to physically separate each of the dummy gates 74 from adjacent dummy gates 74. The dummy gates 74 may also have a lengthwise direction substantially perpendicular to the lengthwise direction of the fins 52.

Figure 5:
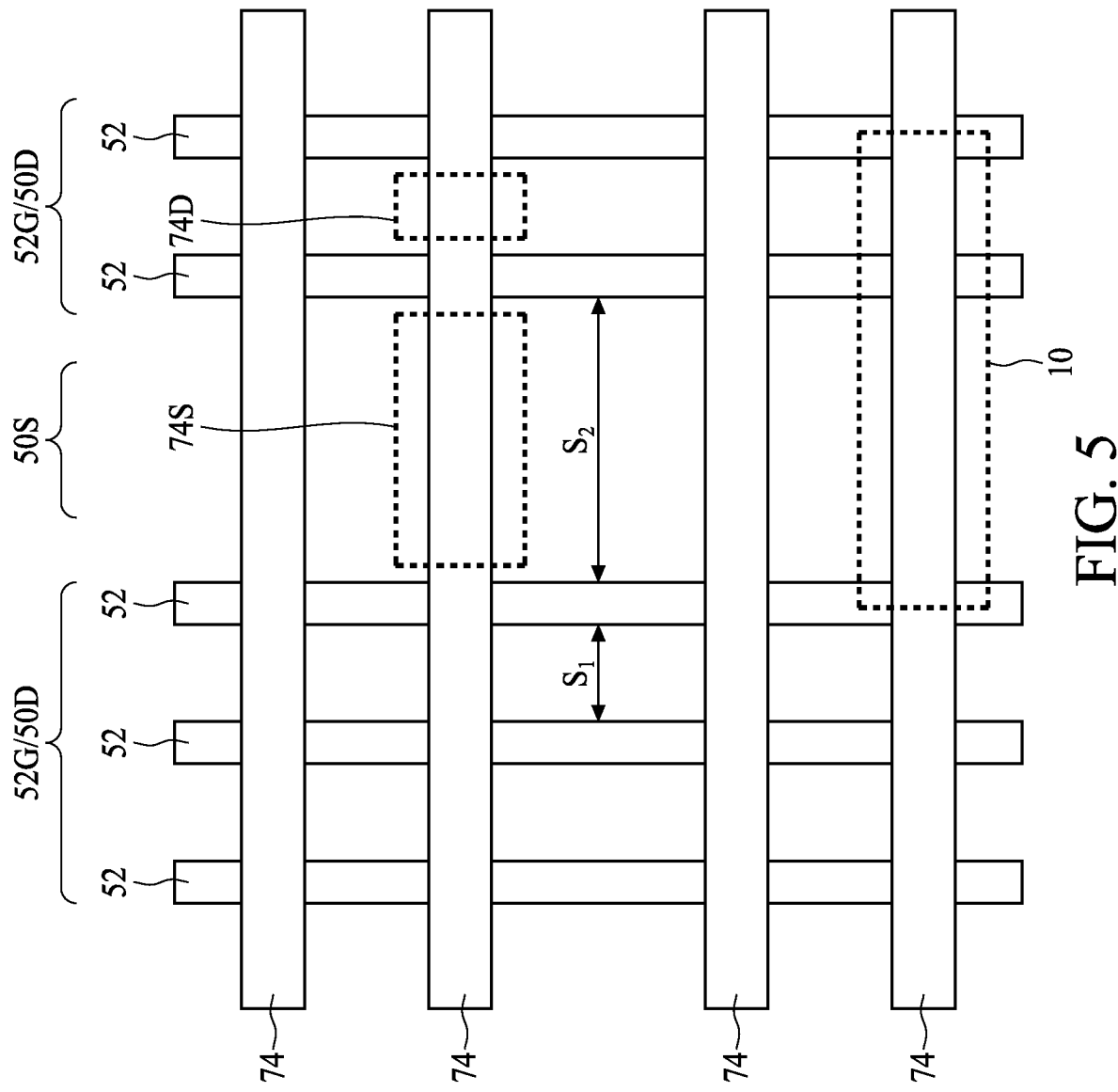

FIG. 5 is a top-down view of FinFETs, in accordance with some embodiments. Some features are omitted for clarity of illustration. According to various embodiments, the fins 52 are formed in fin groups 52G. Each fin group 52G includes fins 52 spaced apart by a first distance $S_1$, and the fin groups 52G are spaced apart by a second distance $S_2$, with the second distance $S_2$ being greater than the first distance $S_1$. The fins groups 52G may contain any desired quantity of fins 52, such as two fins 52, three fins 52, or the like. A device, such as a transistor, can be formed from multiple fins 52, such as from some or all of the fins 52 of a fin group 52G. The regions in which the fin groups 52G are formed (e.g., the regions that contain the fins 52) may be referred to as dense regions 50D, and the regions between the fin groups 52G (e.g., the regions that are free of fins) may be referred to as sparse regions 50S. Each of the sparse regions 50S is disposed between two of the dense regions 50D (e.g., two of the fin groups 52G).

The dummy gates 74 will be subsequently replaced with replacement gates, such as metal gates, for the FinFETs. The replacement gate process includes etching to remove the materials of the dummy gates 74, and deposition to form the materials of the replacement gates. Performing etching and deposition in the dense regions 50D (e.g., those regions with small fin-to-fin spacing) is increasingly challenging as technologies scale down. As a result, the portions of the dummy gates 74 between the fins 52 of adjacent fin groups 52G are easier to replace than the portions of the dummy gates 74 between the fins 52 of a fin group 52G. Put another way, the dummy gate portions 74S in the sparse regions 50S are easier to replace than the dummy gate portions 74D in the dense regions 50D. As will be discussed in greater detail below, the process for replacing the dummy gates 74 includes a spacer treatment process that aids in replacement of the dummy gate portions 74D in the dense regions 50D.

FIGS. 6A through 19B illustrate various additional steps in the manufacturing of embodiment devices. FIGS. 6A, 6B, 7A, 7B, 7C, 7D, 8A, 8B, 9A, 9B, 10A, 10B, 11A, 11B, 12A, 12B, 13A, 13B, 14A, 14B, 15A, 15B, 16A, 16B, 16D, 17A, 17B, 18A, 18B, 19A, and 19B are cross-sectional views that illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure. FIGS. 6C, 11C, 15C, and 16C are top-down views that illustrate a detailed view of a region 10 of FIG. 5, including features in both a sparse regions 50S and an adjacent dense regions 50D.

Figure 6B:
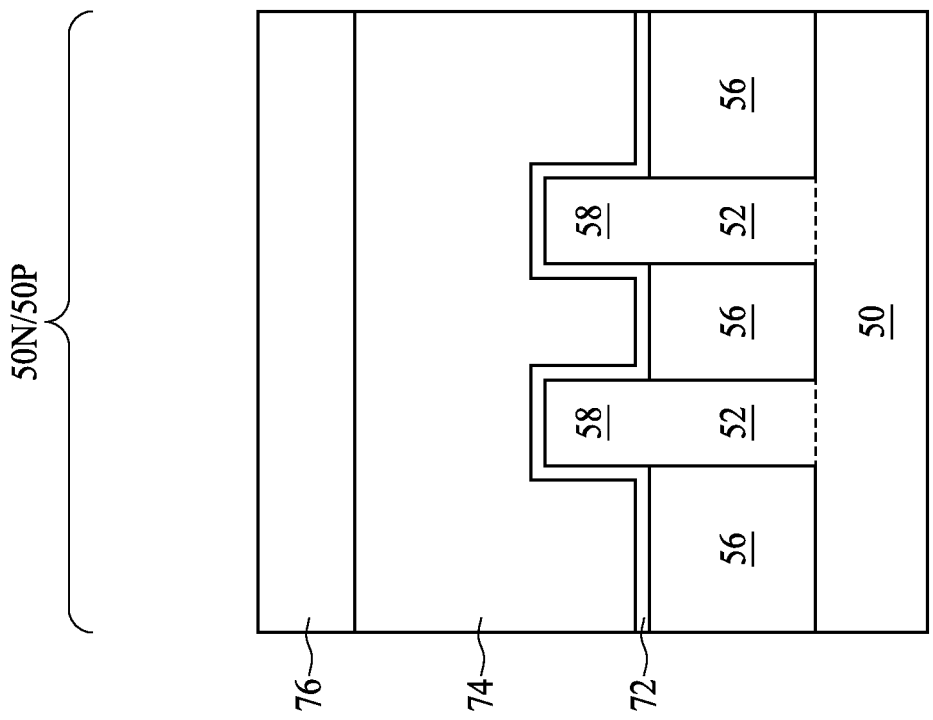
Figure 6A:
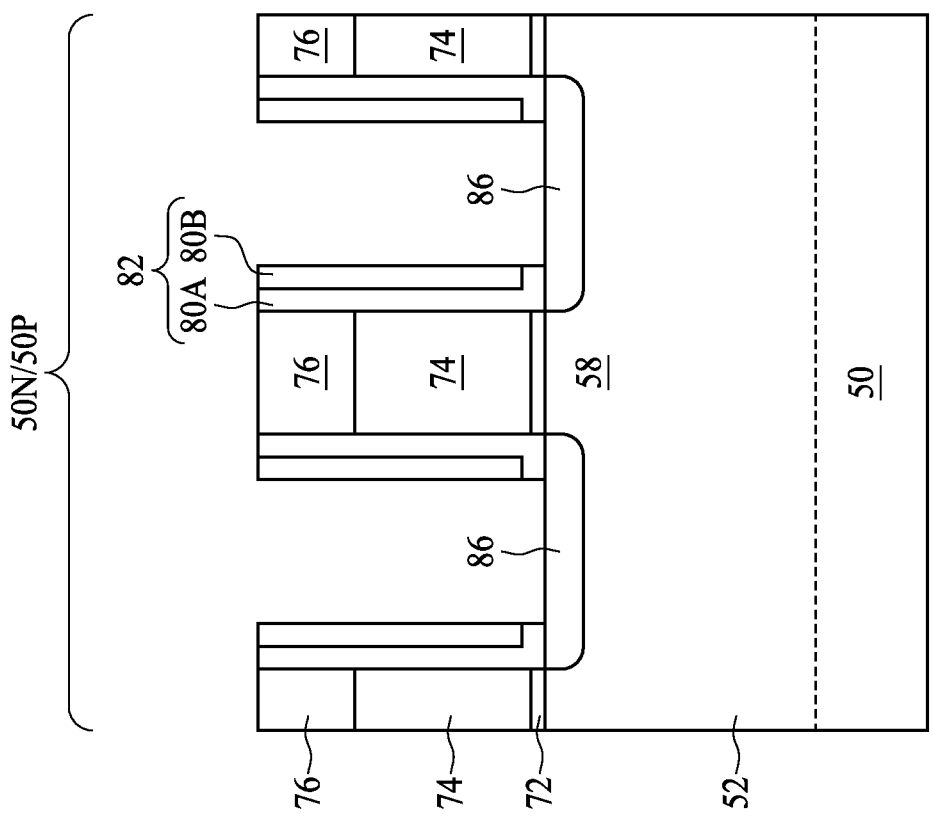

In FIGS. 6A and 6B, gate spacers 82 are formed on sidewalls of the dummy gates 74 and the masks 76. The gate spacers 82 may be formed by conformally depositing one or more insulating material(s) and subsequently etching the insulating material(s). The insulating material(s) may be formed of low-k dielectric materials such as silicon oxide, silicon nitride, silicon carbonitride, silicon oxycarbonitride, a combination thereof, or the like, which may be formed by a conformal deposition process such as chemical vapor deposition (CVD), plasma enhanced chemical vapor deposition (PECVD), atomic layer deposition (ALD), or the like. The insulating material(s), when etched, have portions left on the sidewalls of the dummy gates 74 and the masks 76 (hence forming the gate spacers 82). After the etching, the gate spacers 82 can have straight sidewalls (as illustrated) or can have curved sidewalls (not illustrated).

According to various embodiments, the gate spacers 82 each include multiple layer(s), e.g., a first spacer layer 80A and a second spacer layer 80B. In some embodiments, the first spacer layers 80A and the second spacer layers 80B are each formed of silicon oxycarbonitride (e.g., $SiO_xN_yC_{1-x-y}$, where x and y are in the range of 0 to 1). In some embodiments, the silicon oxycarbonitride of the first spacer layers 80A has a different composition than the silicon oxycarbonitride of the second spacer layers 80B.

During or after the formation of the gate spacers 82, implants for lightly doped source/drain (LDD) regions 86 may be performed. In the embodiments with different device types, similar to the implants for the wells previously discussed, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The LDD regions 86 may have a concentration of impurities in the range of about $10^{15}$ cm$^{-3}$ to about $10^{19}$ cm$^{-3}$. An anneal may be used to repair implant damage and to activate the implanted impurities.

Figure 6C:
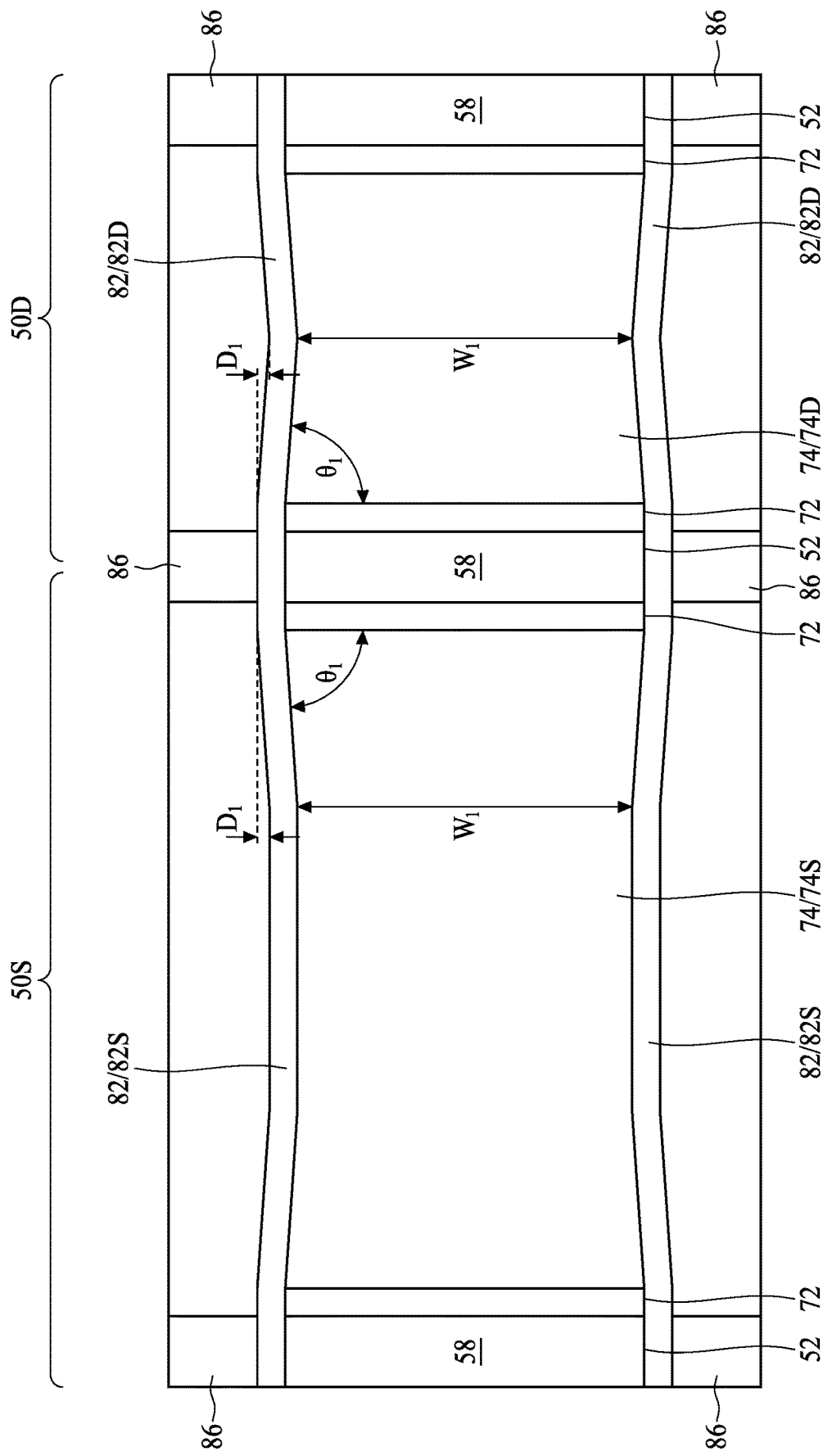

Referring to FIG. 6C, the profile shape of the dummy gates 74 in a top-down view is shown. FIG. 6C is illustrated along reference cross-section C-C in FIG. 4, so as to more specifically illustrate features of the dummy gates 74 between the fins 52. During the patterning of the dummy gates 74, pattern loading effects can cause sidewalls of the portions of the dummy gates 74 proximate the fins 52 to be etched less than sidewalls of the portions of the dummy gates 74 distal the fins 52. The dummy gates 74 thus have a bowed profile shape in a top-down view, such that the portions of the dummy gates 74 proximate the fins 52 have a greater width $W_1$ than the portions of the dummy gates 74 distal the fins 52. The width $W_1$ can be in the range of about 5 nm to about 20 nm when devices with small channel lengths are desired, and the width $W_1$ can be in the range of about 20 nm to about 150 nm when devices with large channel lengths are desired. Each portion of the dummy gates 74 between a pair of the fins 52 has a minimum width $W_1$ at a point that is equidistant from the fins 52.

The profile shape of the gate spacers 82 in the top-down view is also shown. The gate spacers 82 are formed in pairs along sidewalls of the dummy gates 74. The gate spacers 82 thus also have a bowed profile shape in a top-down view, such that the portions of the gate spacers 82 distal the fins 52 bow inwards towards one another by a distance $D_1$, which is measured from the portions of the gate spacers 82 proximate the fins 52. The distance $D_1$ can be in the range of about 0.5 nm to about 5 nm. As a result of the inward bowing, the sidewalls of the gate spacers 82 each form an acute angle $\theta_1$ with a plane parallel to the sidewalls of the fins 52. The angle $\theta_1$ can be in the range of about 45 degrees to about 85 degrees.

In the illustrated embodiment, the dummy gate portions 74S in the sparse regions 50S have the same width $W_1$ as the dummy gate portions 74D in the dense regions 50D, and the gate spacer portions 82S in the sparse regions 50S bow inward by the same distance $D_1$ as the gate spacer portions 82D in the dense regions 50D. In another embodiment, the dummy gate portions 74S in the sparse regions 50S have a different width than the dummy gate portions 74D in the dense regions 50D, and the gate spacer portions 82S in the sparse regions 50S bow inward by a different distance than the gate spacer portions 82D in the dense regions 50D. For example, pattern loading effects, such as those discussed above, can cause the dummy gate portions 74S in the sparse regions 50S to be etched more and thus have a lesser width than the dummy gate portions 74D in the dense regions 50D. As a result, the gate spacer portions 82S in the sparse regions 50S can bow inward by a greater distance than the gate spacer portions 82D in the dense regions 50D.

As will be discussed in greater detail below, a spacer treatment process will be subsequently performed to increase the distance $D_1$ by which the portions of the gate spacers 82 bow inward. Notably, the spacer treatment process will increase the bowing of the gate spacer portions 82D in the dense regions 50D by more than it increases the bowing of the gate spacer portions 82S in the sparse regions 50S. Thus, the replacement gates formed in the dense regions 50D will have a lesser width than the replacement gates formed in the sparse regions 50S.

Figure 7B:
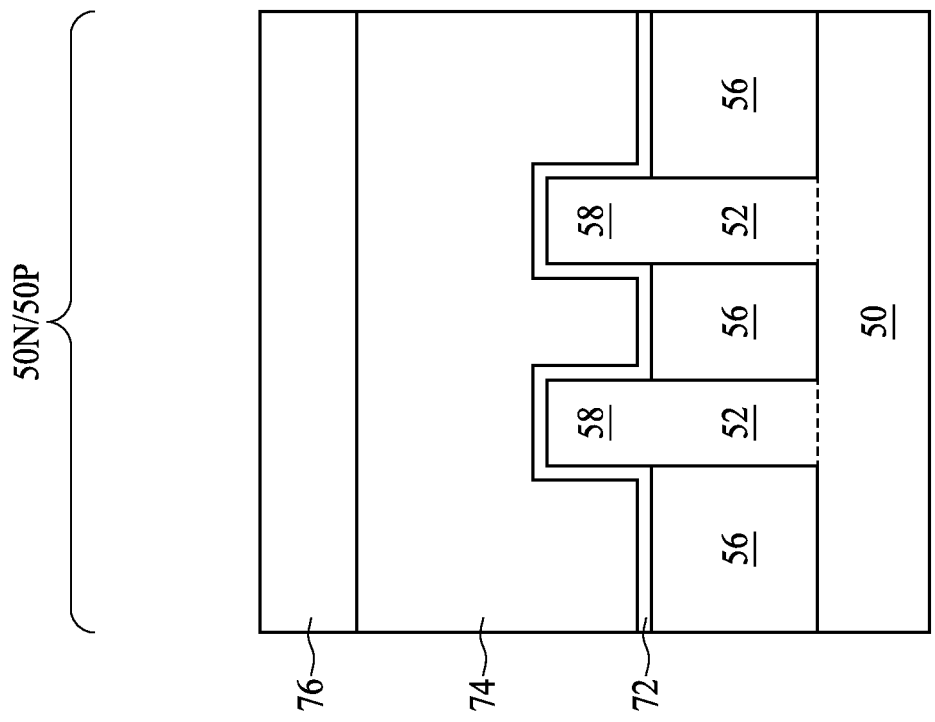
Figure 7A:
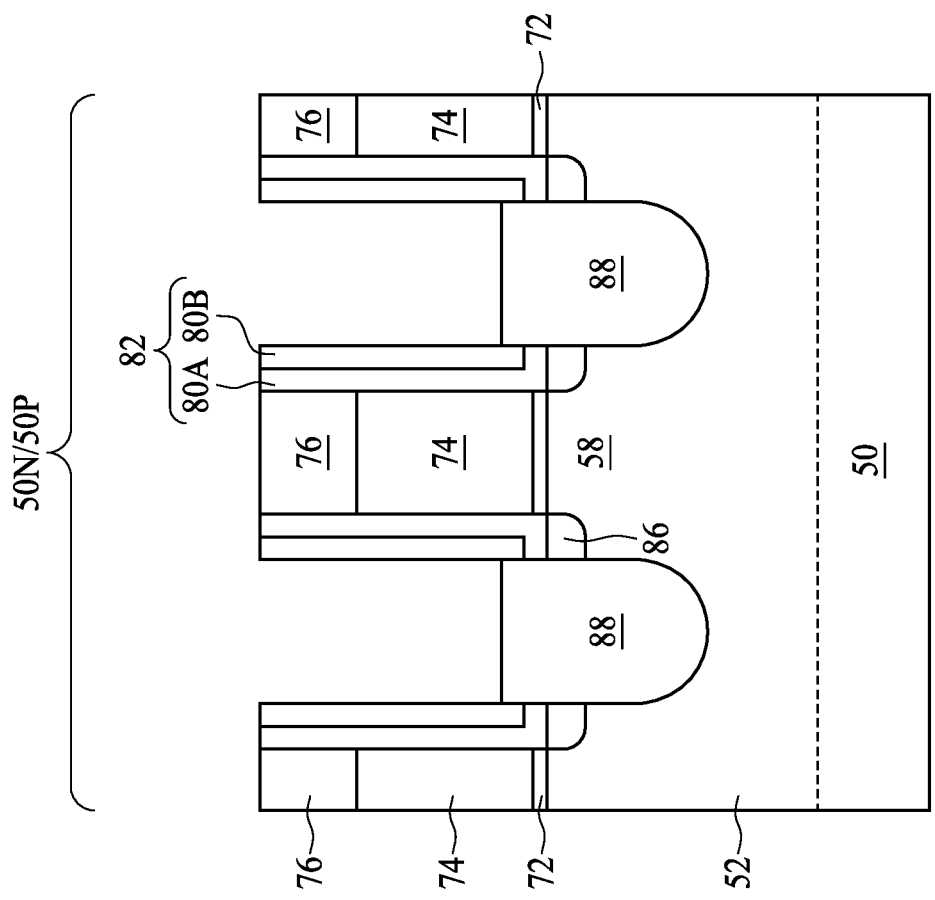
Figure 7D:
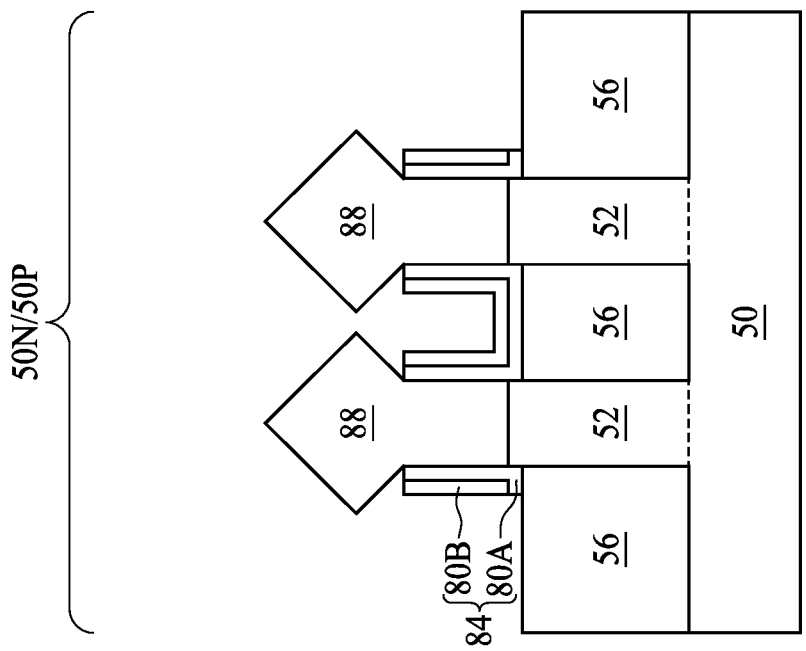
Figure 7C:
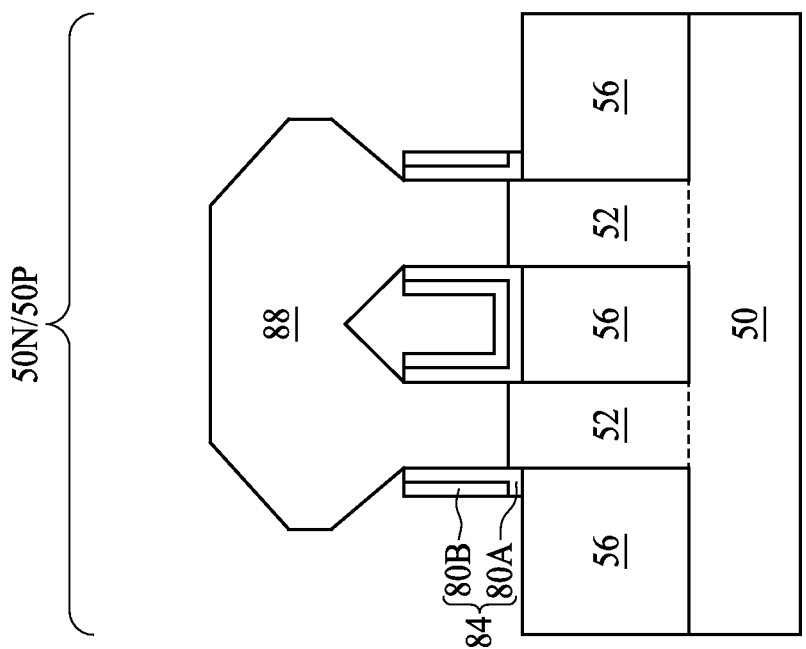

In FIGS. 7A and 7B, epitaxial source/drain regions 88 are formed in the fins 52. The epitaxial source/drain regions 88 are formed in the fins 52 such that each dummy gate 74 (and corresponding channel region 58) is disposed between respective neighboring pairs of the epitaxial source/drain regions 88. In some embodiments the epitaxial source/drain regions 88 may extend into, and may also penetrate through, the fins 52. In some embodiments, the gate spacers 82 are used to separate the epitaxial source/drain regions 88 from the dummy gates 74 by an appropriate lateral distance so that the epitaxial source/drain regions 88 do not short out subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P and etching source/drain regions of the fins 52 in the n-type region 50N to form recesses in the fins 52. Then, the epitaxial source/drain regions 88 in the n-type region 50N are epitaxially grown in the recesses. The epitaxial source/drain regions 88 may include any acceptable material, such as appropriate for n-type FinFETs. For example, if the fins 52 are silicon, the epitaxial source/drain regions 88 in the n-type region 50N may include materials exerting a tensile strain in the channel regions 58, such as silicon, silicon carbide, phosphorous doped silicon carbide, silicon phosphide, or the like. The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N and etching source/drain regions of the fins 52 in the p-type region 50P to form recesses in the fins 52. Then, the epitaxial source/drain regions 88 in the p-type region 50P are epitaxially grown in the recesses. The epitaxial source/drain regions 88 may include any acceptable material, such as appropriate for p-type FinFETs. For example, if the fins 52 are silicon, the epitaxial source/drain regions 88 in the p-type region 50P may comprise materials exerting a compressive strain in the channel regions 58, such as silicon-germanium, boron doped silicon-germanium, germanium, germanium tin, or the like. The epitaxial source/drain regions 88 in the p-type region 50P may have surfaces raised from respective surfaces of the fins 52 and may have facets.

The epitaxial source/drain regions 88 and/or the fins 52 may be implanted with dopants to form source/drain regions, similar to the process previously discussed for forming the LDD regions 86, followed by an anneal. The source/drain regions may have an impurity concentration of between about $10^{19}$ cm$^{-3}$ and about $10^{21}$ cm$^{-3}$. The n-type and/or p-type impurities for the source/drain regions may be any of the impurities previously discussed. In some embodiments, the epitaxial source/drain regions 88 may be in situ doped during growth.

As a result of the epitaxy processes used to form the epitaxial source/drain regions 88 in the n-type region 50N and the p-type region 50P, upper surfaces of the epitaxial source/drain regions have facets which expand laterally outward beyond sidewalls of the fins 52. In some embodiments, these facets cause adjacent epitaxial source/drain regions 88 to merge as illustrated by FIG. 7C. In some embodiments, adjacent epitaxial source/drain regions 88 remain separated after the epitaxy process is completed as illustrated by FIG. 7D. For example, adjacent epitaxial source/drain regions 88 of the fins 52 in a same fin group 52G (see FIG. 5) may (or may not) merge. The spacer etch used to form the gate spacers 82 may be adjusted to also form fin spacers 84 on sidewalls of the fins 52. In the illustrated embodiment, the fin spacers 84 cover a portion of the sidewalls of the fins 52 that extend above the STI regions 56, thereby blocking the epitaxial growth. The fin spacers 84 between adjacent fins 52 may be merged (as shown), or may be etched so that they are separated. In another embodiment, the spacer etch used to form the gate spacers 82 is adjusted to not form the gate spacers 82 on the STI regions 56, so as to allow the epitaxially grown regions to extend to the surface of the STI regions 56.

Figure 8B:
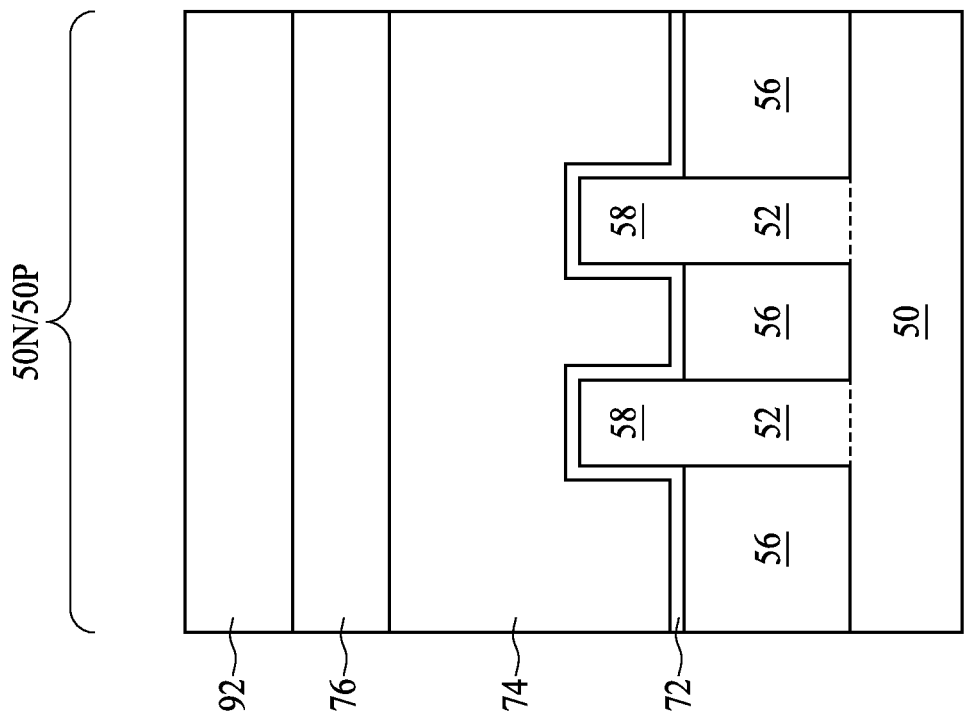
Figure 8A:
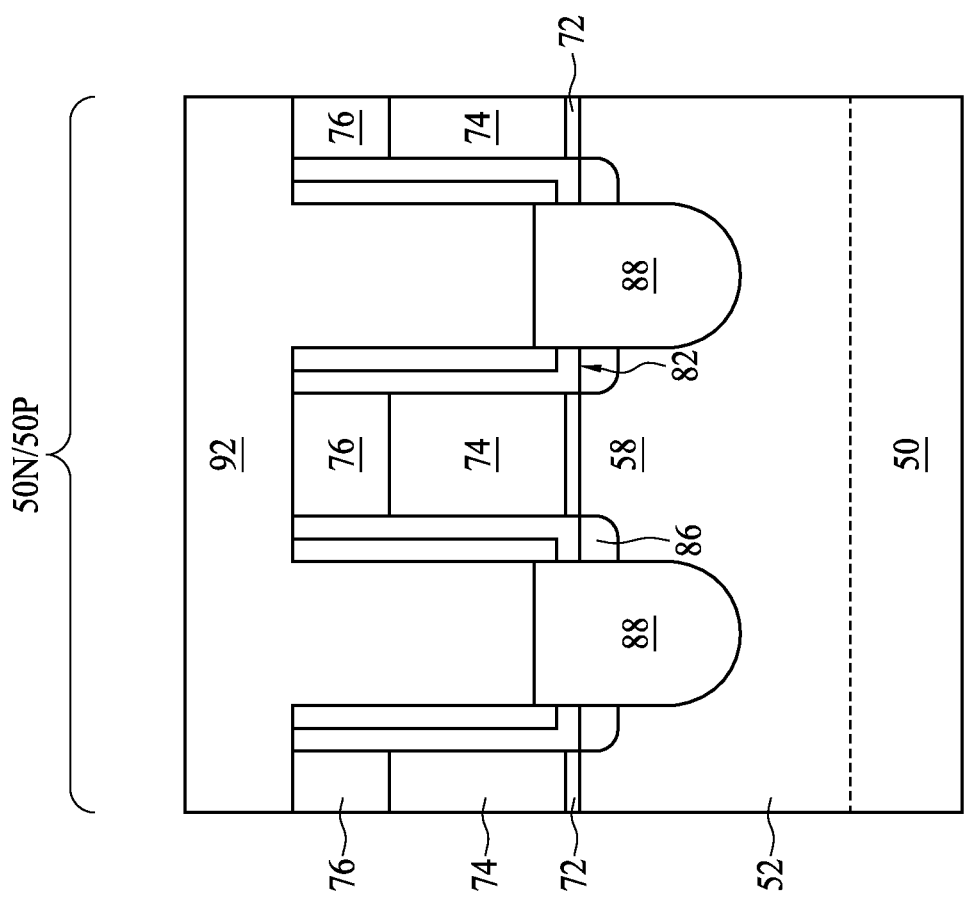

In FIGS. 8A and 8B, a first ILD 92 is deposited over the epitaxial source/drain regions 88, the gate spacers 82, the STI regions 56, and the masks 76 (if present) or the dummy gates 74. The first ILD 92 may be formed of a dielectric material, and may be deposited by any suitable method, such as CVD, plasma-enhanced CVD (PECVD), or FCVD. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) is formed between the first ILD 92 and the epitaxial source/drain regions 88, the gate spacers 82, the STI regions 56, and the masks 76 (if present) or the dummy gates 74. The CESL may comprise a dielectric material, such as, silicon nitride, silicon oxide, silicon oxynitride, or the like, having a lower etch rate than the material of the first ILD 92.

Figure 9B:
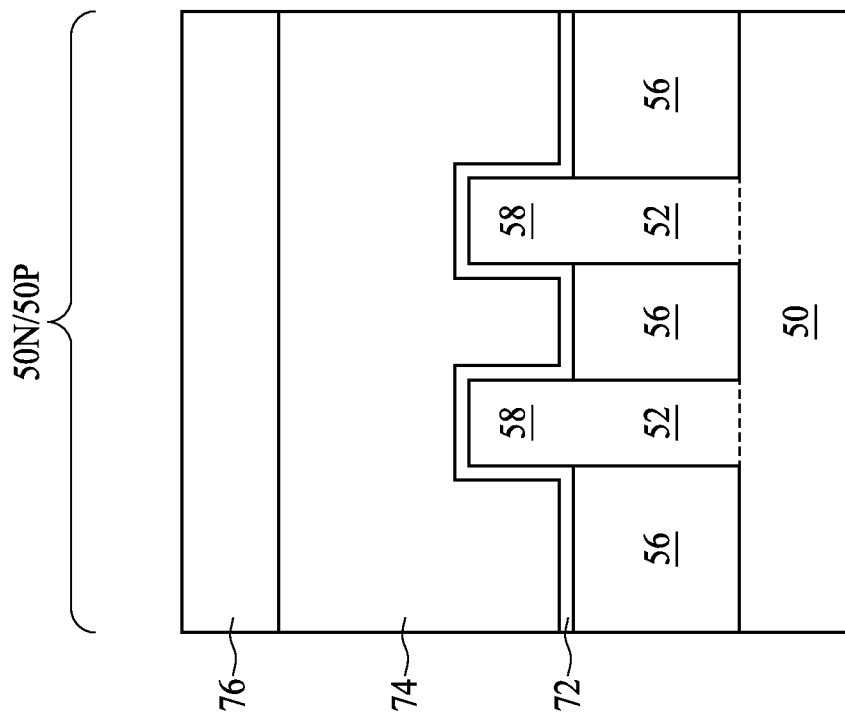
Figure 9A:
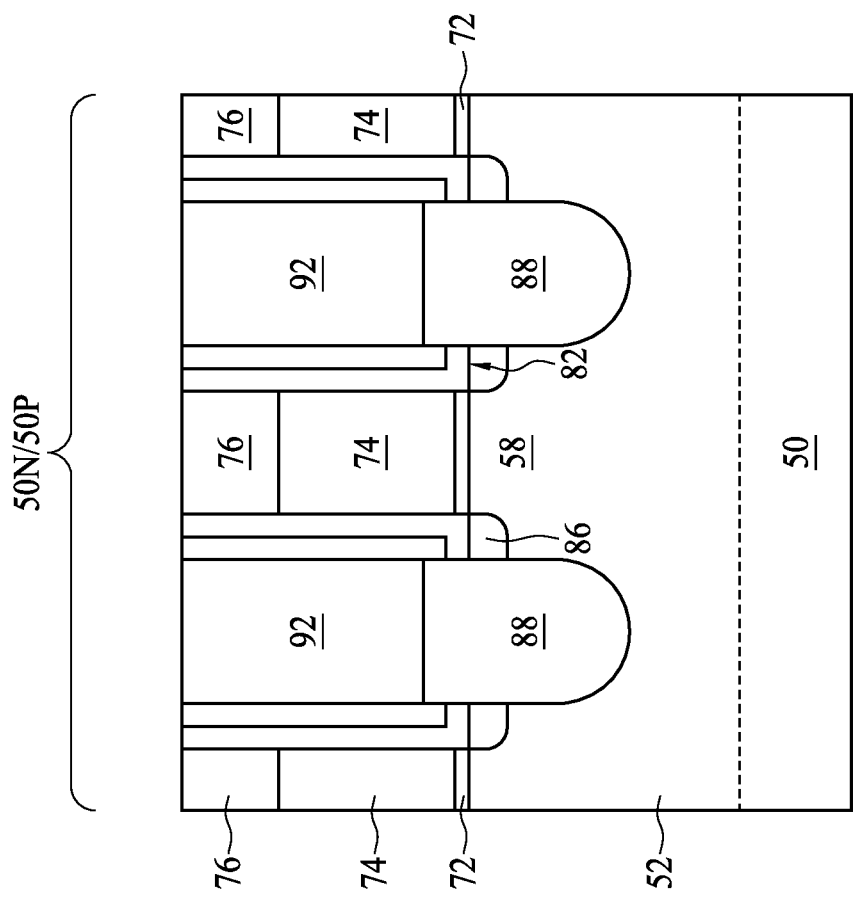

In FIGS. 9A and 9B, a planarization process, such as a CMP, may be performed to level the top surface of the first ILD 92 with the top surfaces of the masks 76 (if present) or the dummy gates 74. The planarization process may also remove the masks 76 on the dummy gates 74, and portions of the gate spacers 82 along sidewalls of the masks 76. After the planarization process, the top surfaces of the dummy gates 74, the gate spacers 82, and the first ILD 92 are coplanar (within process variations). Accordingly, the top surfaces of the dummy gates 74 are exposed through the first ILD 92. In some embodiments, the masks 76 may remain, in which case the planarization process levels the top surface of the first ILD 92 with the top surfaces of the masks 76.

Figure 10B:
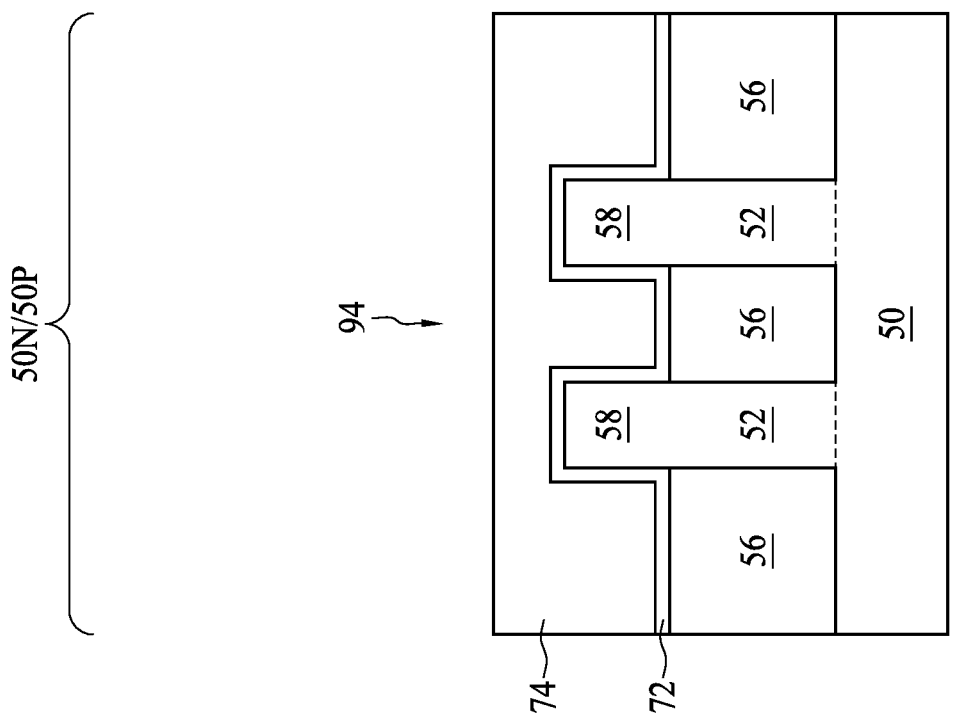
Figure 10A:
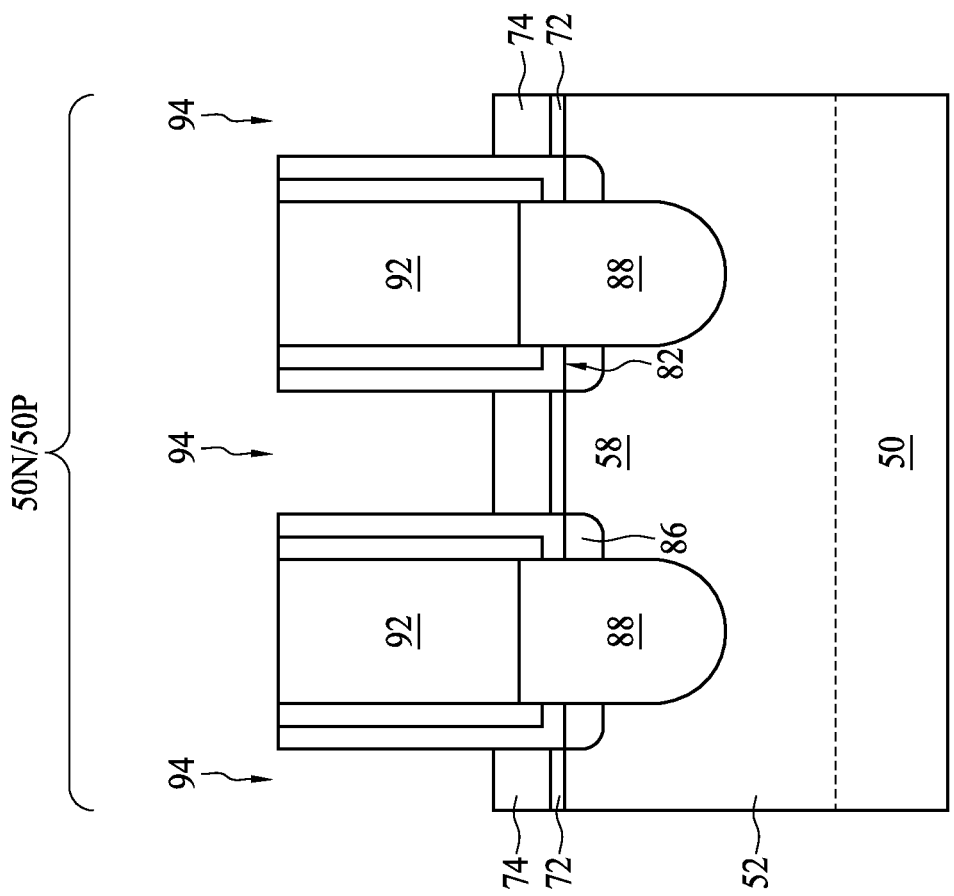

In FIGS. 10A and 10B, the masks 76 (if present) are removed and the dummy gates 74 are recessed in one or more etching step(s), so that recesses 94 are formed between opposing portions of the gate spacers 82. The recesses 94 expose the sidewalls of the gate spacers 82. In some embodiments, the dummy gates 74 are recessed by an anisotropic dry etch process. For example, the etching process may include a dry etch process using reaction gas(es) that selectively etch the dummy gates 74 with little or no etching of the first ILD 92 or the gate spacers 82. Each recess 94 overlies a channel region 58 of a respective fin 52. Timed etch processes may be used to stop the etching of the dummy gates 74 after the recesses 94 reach a desired depth. Specifically, the depth of the recesses 94 is controlled so that a majority of the dummy gates 74 is removed, but the fins 52 and the dummy dielectrics 72 remain covered after the recesses 94 are formed. In some embodiment, forming the recesses 94 reduces the height of the dummy gates 74 by about 80% to about 90%.

Figure 11B:
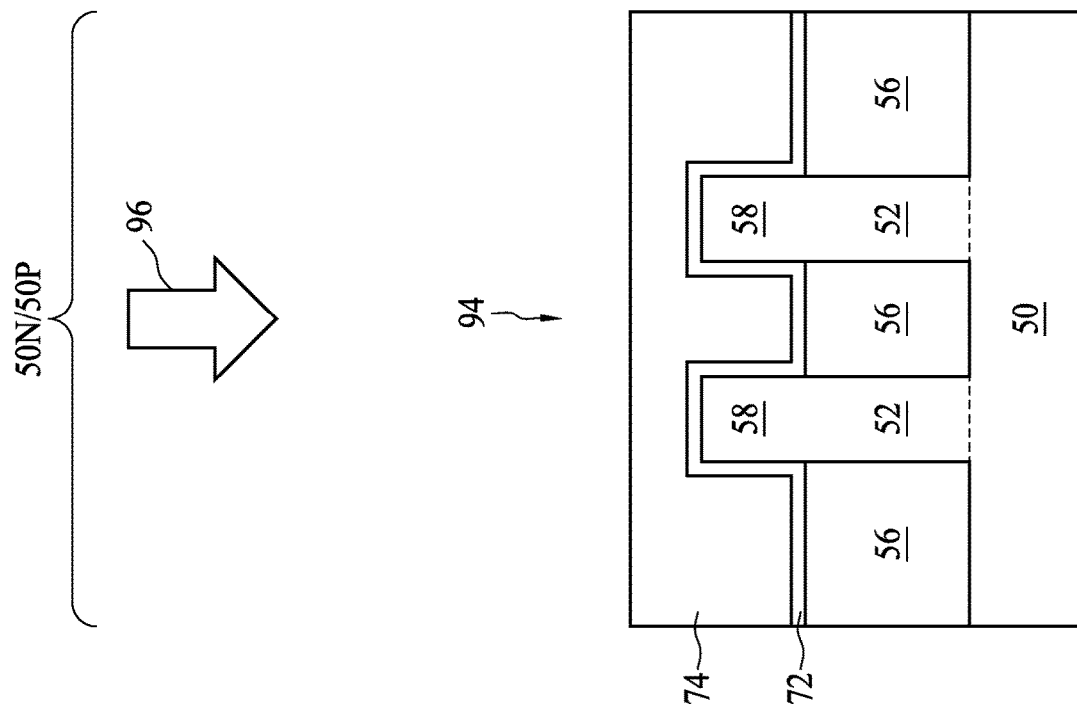
Figure 11A:
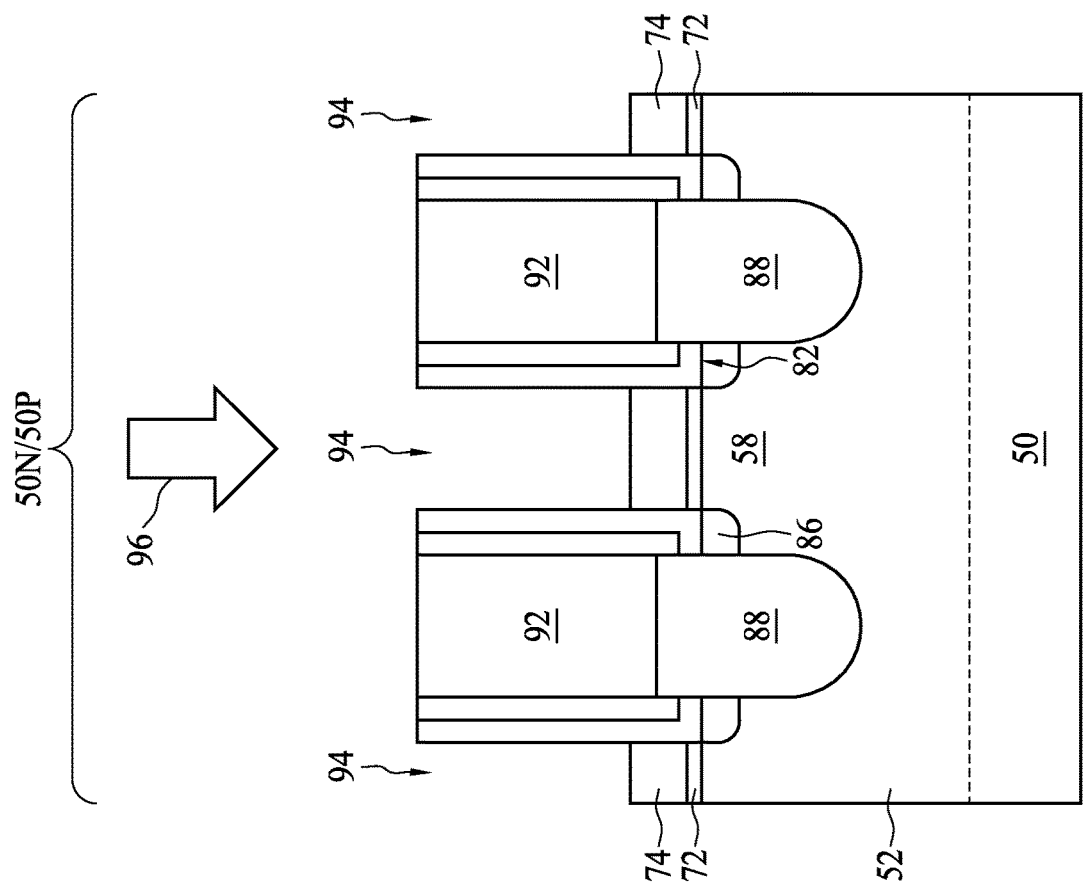

In FIGS. 11A and 11B, a spacer treatment process 96 is performed to increase the bowing of the gate spacers 82. Specifically, the spacer treatment process 96 bows the sidewalls of the gate spacers 82 towards one another. The spacer treatment process 96 induces stress in the material of the gate spacers 82, thereby causing them to bow in the top-down view (discussed in greater detail below). In some embodiments, the spacer treatment process 96 expands (e.g., increases the volume of) the gate spacers 82, causing them to bow as they expand in the recesses 94. In various embodiments, the spacer treatment process 96 includes a nitridation process, an oxidation process, combinations thereof, or the like.

In some embodiments, the spacer treatment process 96 includes a nitridation treatment process such as an ammonia soak process, in which the gate spacers 82 are exposed to ammonia ($NH_3$). The ammonia soak process may be performed in a chamber such as an etch chamber. A gas source is dispensed in the chamber. The gas source includes ammonia gas and an carrier gas. The carrier gas may be an inert gas such as argon (Ar), helium (He), xenon (Xe), neon (Ne), krypton (Kr), Radon (Rn), the like, or combinations thereof. In some embodiments, the ammonia gas is from about 5% to about 20% of the gas source, and the carrier gas is from about 80% to about 95% of the gas source. The gas source may be dispensed at a flow rate of from about 50 seem to about 500 sccm. The nitrogen in the ammonia readily bonds with any open bonds of silicon atoms of the gate spacers 82, thereby nitrating the gate spacers 82 and producing hydrogen byproducts, which can be evacuated from the chamber. The ammonia is kept in the chamber until the gate spacers 82 have been nitrated by a desired amount. In some embodiments, the ammonia soak process is performed at a temperature of from about 300° C. to about 600° C., and for a duration of from about 5 seconds to about 300 seconds.

In some embodiments, the spacer treatment process 96 includes a nitridation treatment process such as a nitrogen radical treatment process, in which the gate spacers 82 are exposed to nitrogen free radicals. The nitrogen radical treatment process may be performed in a chamber such as an etch chamber. A gas source is dispensed in the chamber. The gas source includes a plurality of radical precursor gases and an carrier gas. The radical precursor gases include $H_2$ and $N_2$. The carrier gas may be an inert gas such as argon (Ar), helium (He), xenon (Xe), neon (Ne), krypton (Kr), Radon (Rn), the like, or combinations thereof. In some embodiments, the $H_2$ is from about 5% to about 20% of the gas source, the $N_2$ is from about 5% to about 20% of the gas source, and the carrier gas is from about 60% to about 90% of the gas source. The gas source may be dispensed at a flow rate of from about 50 seem to about 500 sccm. A plasma is generated from the gas source. The plasma may be generated by a plasma generator such as a transformer-coupled plasma generator, inductively coupled plasma system, magnetically enhanced reactive ion etching system, electron cyclotron resonance system, remote plasma generator, or the like. The plasma generator generates radio frequency power that produces a plasma from the gas source by applying a voltage above the striking voltage to electrodes in the chamber containing the gas source. When the plasma is generated, nitrogen free radicals and corresponding ions are generated. The nitrogen free radicals readily bond with any open bonds of silicon atoms of the gate spacers 82, thereby nitrating the gate spacers 82. The nitrogen free radicals are kept in the chamber until the gate spacers 82 have been nitrated by a desired amount. In some embodiments, the nitrogen radical treatment process is performed at a temperature of from about 300° C. to about 600° C., for a duration of from about 5 seconds to about 300 seconds, and at a pressure of from about 1 Torr to about 50 Torr.

In some embodiments, the spacer treatment process 96 includes an oxidation treatment process such as a low-temperature anneal process, in which the gate spacers 82 are annealed in oxygen at a low temperature. For example, a rapid thermal anneal (RTA) may be performed in an ambient containing oxygen and an inert gas. The inert gas may be argon (Ar), helium (He), xenon (Xe), neon (Ne), krypton (Kr), Radon (Rn), the like, or combinations thereof. In some embodiments, the oxygen is from about 5% to about 20% of the ambient, and the inert gas is from about 80% to about 95% of the ambient. The thermal oxidation may be performed at a temperature of from about 150° C. to about 500° C., and for a duration of from about 5 seconds to about 200 seconds.

Figure 11C:
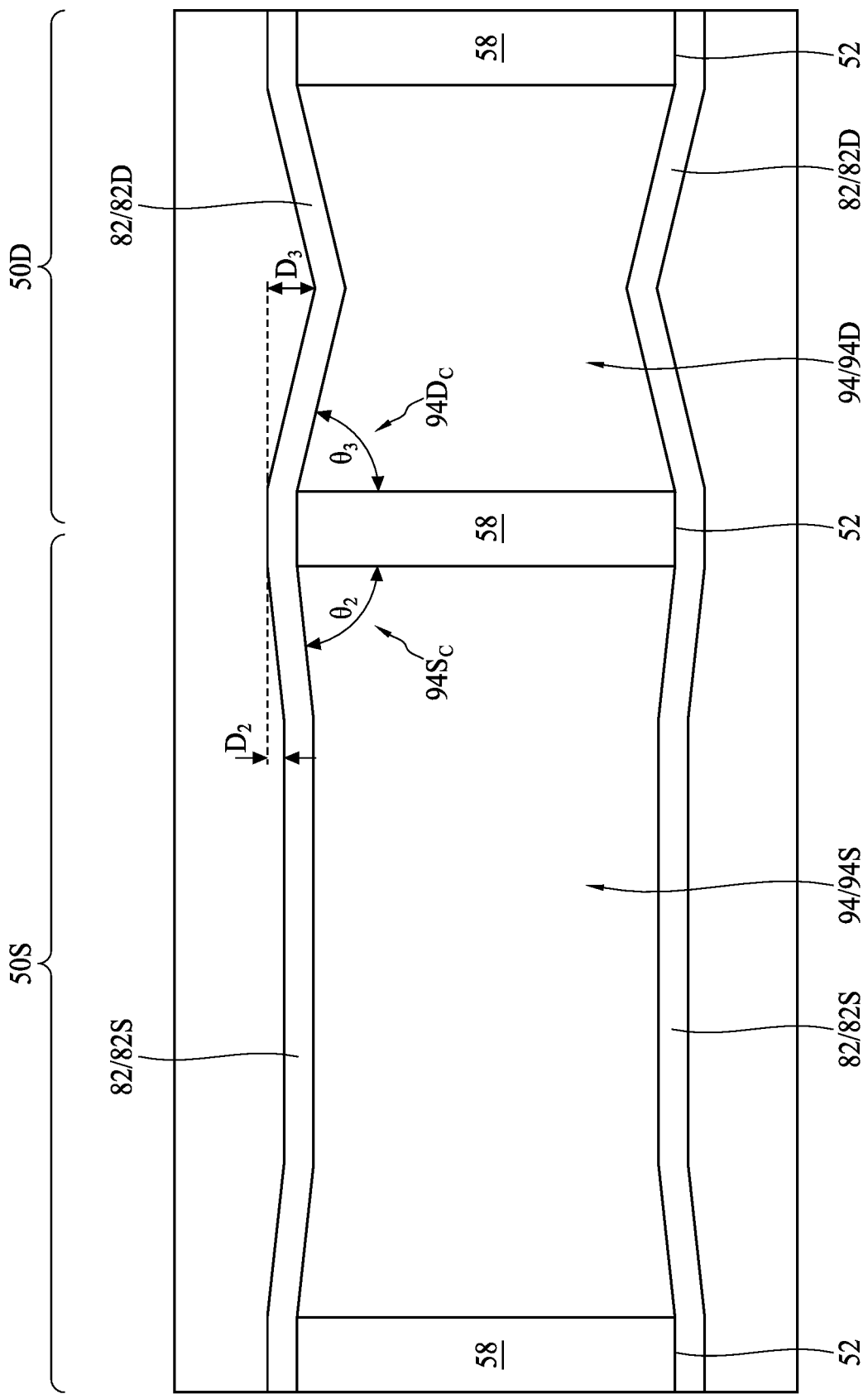

Referring to FIG. 11C, the profile shape of the gate spacers 82 in a top-down view after the spacer treatment process 96 is shown. The distance by which the gate spacer portions 82S in the sparse regions 50S bow inward is increased to a distance $D_2$, which is greater than the distance $D_1$ (see FIG. 6C). Similarly, the distance by which the gate spacer portions 82D in the dense regions 50D bow inward is increased to a distance $D_3$, which is greater than the distance $D_1$ (see FIG. 6C). The distance $D_2$ can be in the range of about 1 nm to about 10 nm, and the distance $D_3$ can be in the range of about 1.5 nm to about 15 nm. The spacer treatment process 96 causes the gate spacer portions 82D in the dense regions 50D to bow inward by more than the gate spacer portions 82S in the sparse regions 50S. For example, because of the high density of the fins 52 in the dense regions 50D, the gate spacers 82 have little room to expand in the dense regions 50D, and so they bow outward instead of expanding in-place. As such, the distance $D_3$ is greater than the distance $D_2$. The distance $D_3$ can be from about 5% to about 50% greater than the distance $D_2$.

The recess portions 94S in the sparse regions 50S have corners $94S_C$ that are defined by the sidewalls of the gate spacer portions 82S in the sparse regions 50S and the sidewalls of the fins 52. The corners $94S_C$ form an acute angle $\theta_2$, with the angle $\theta_2$ being less than the angle $\theta_1$ (see FIG. 6C). Similarly, the recess portions 94D in the dense regions 50D have corners $94D_C$ that are defined by the sidewalls of the gate spacer portions 82D in the dense regions 50D and the sidewalls of the fins 52. The corners $94D_C$ form an acute angle $\theta_3$, with the angle $\theta_3$ being less than the angle $\theta_1$ (see FIG. 6C). The angle $\theta_2$ can be in the range of about 65 degrees to about 85 degrees, and the angle $\theta_3$ can be in the range of about 45 degrees to about 70 degrees. For similar reasons as those discussed with respect to the distances $D_2$, $D_3$, the angle $\theta_2$ is greater than the angle $\theta_3$. The angle $\theta_2$ can be from about 10% to about 40% greater than the angle $\theta_3$. As will be discussed in greater detail below, decreasing the sizes of the angles $\theta_2$, $\theta_3$ aids in replacement of the dummy gate portions 74D in the dense regions 50D in a subsequent gate replacement process.

Figure 12B:
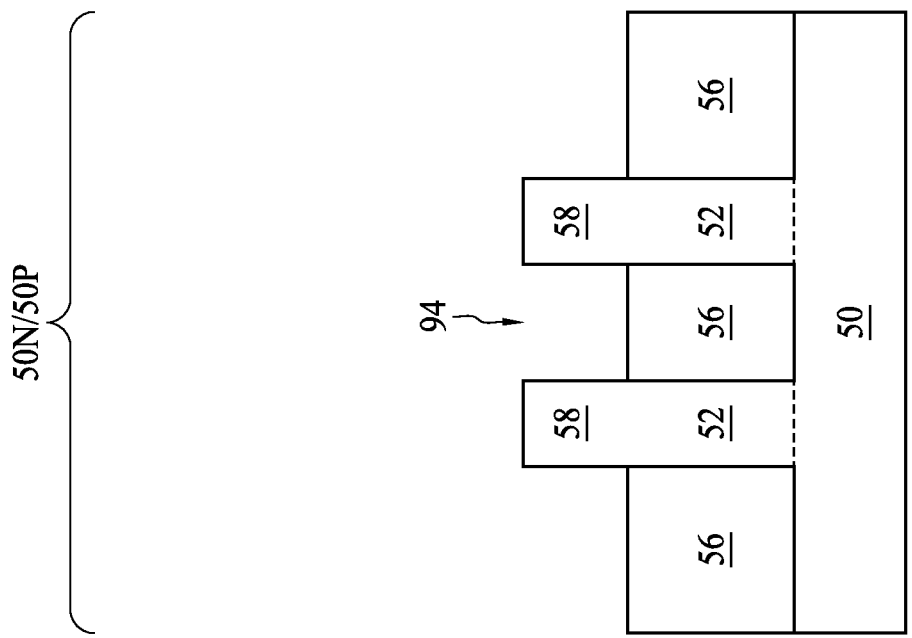
Figure 12A:
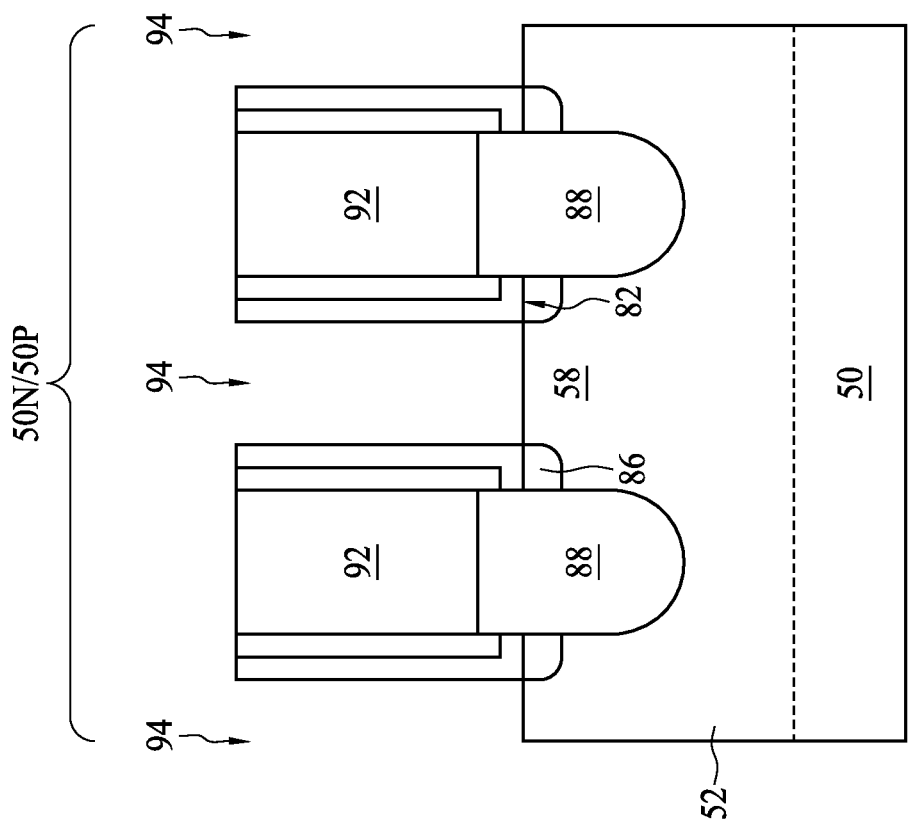

In FIGS. 12A and 12B, the remaining portions of the dummy gates 74 are removed in one or more etching step(s), so that the recesses 94 are expanded. Portions of the dummy dielectrics 72 in the recesses 94 may also be removed. In some embodiments, only the dummy gates 74 are removed and the dummy dielectrics 72 remain and are exposed by the recesses 94. In some embodiments, the dummy dielectrics 72 are removed from recesses 94 in a first region of the die (e.g., a core logic region) and remain in recesses 94 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 with little or no etching of the first ILD 92 or the gate spacers 82. In some embodiments, the etching process for removing the remaining portions of the dummy gates 74 uses the same reaction gas(es) as the etching process for recessing the dummy gates 74 (discussed above for FIGS. 10A and 10B). During the removal, the dummy dielectrics 72 may be used as etch stop layers when the dummy gates 74 are etched. The dummy dielectrics 72 may then be optionally removed after the removal of the dummy gates 74.

Figure 13B:
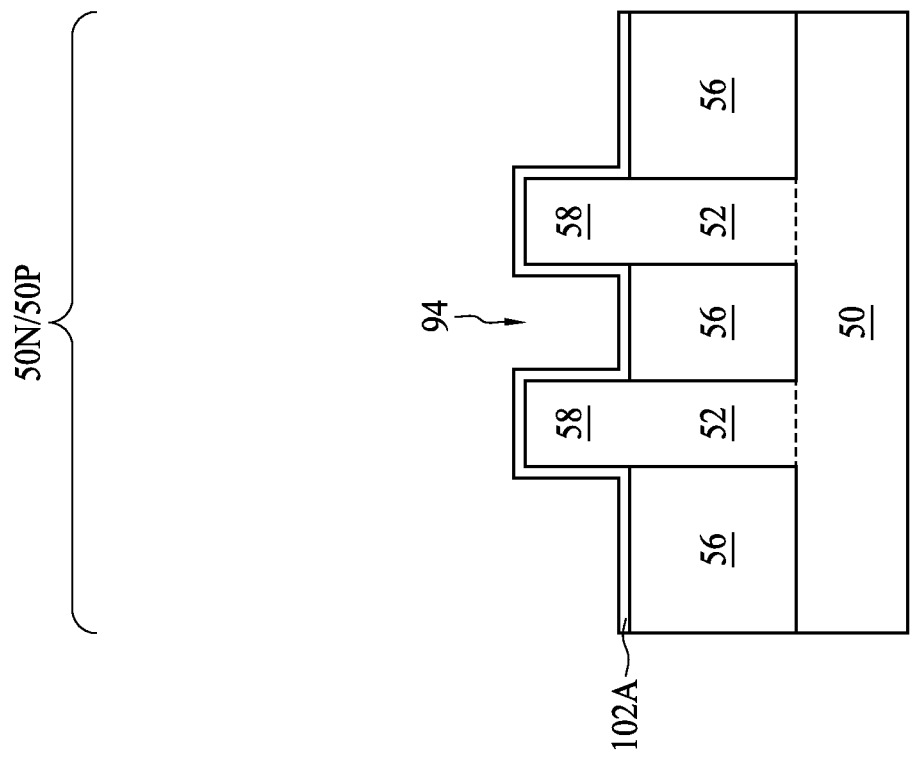
Figure 13A:
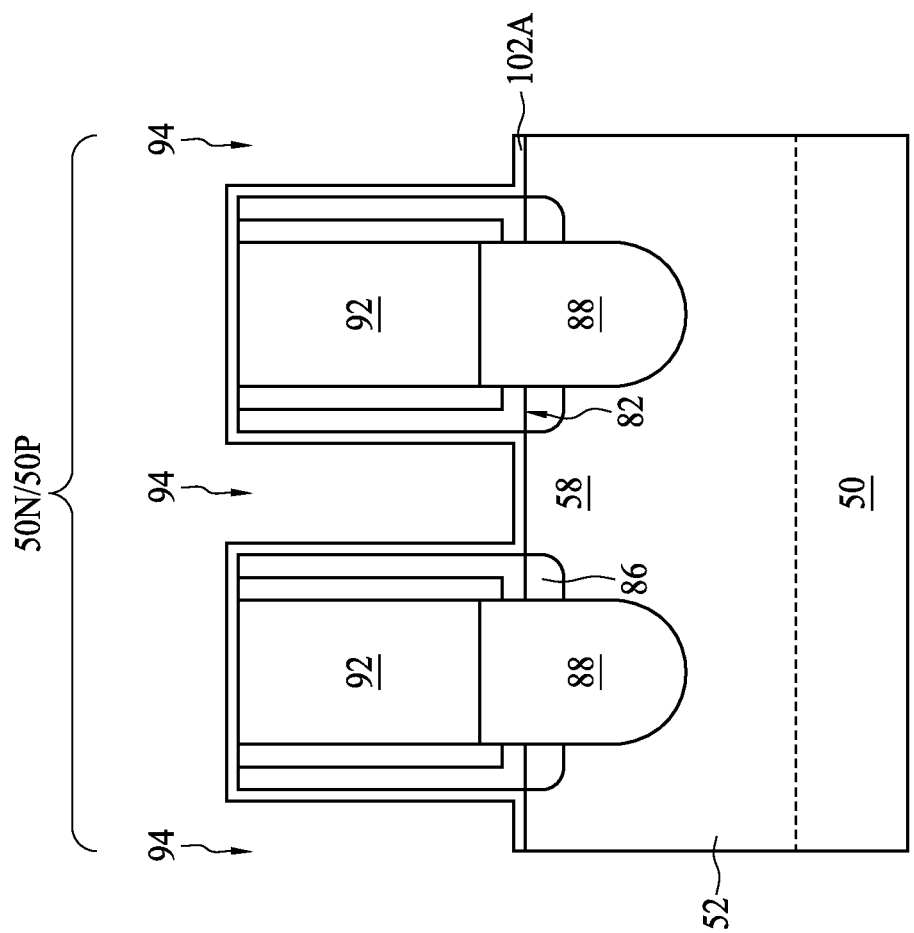

In FIGS. 13A and 13B, a first gate dielectric layer 102A is deposited in the recesses 94, such as on the top surfaces and the sidewalls of the fins 52 and on the sidewalls of the gate spacers 82. The first gate dielectric layer 102A may also be formed on the top surfaces of the first ILD 92. In some embodiments, the first gate dielectric layer 102A includes one or more layers of silicon oxide, silicon nitride, metal oxide, metal silicate, or the like. For example, in some embodiments, the first gate dielectric layer 102A includes an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The first gate dielectric layer 102A may include a dielectric layer having a k-value greater than about 7.0. The formation methods of the first gate dielectric layer 102A may include Molecular-Beam Deposition (MBD), ALD, PECVD, and the like. In embodiments where portions of the dummy dielectrics 72 remain in the recesses 94, the first gate dielectric layer 102A includes a material of the dummy dielectrics 72 (e.g., silicon oxide).

Figure 14B:
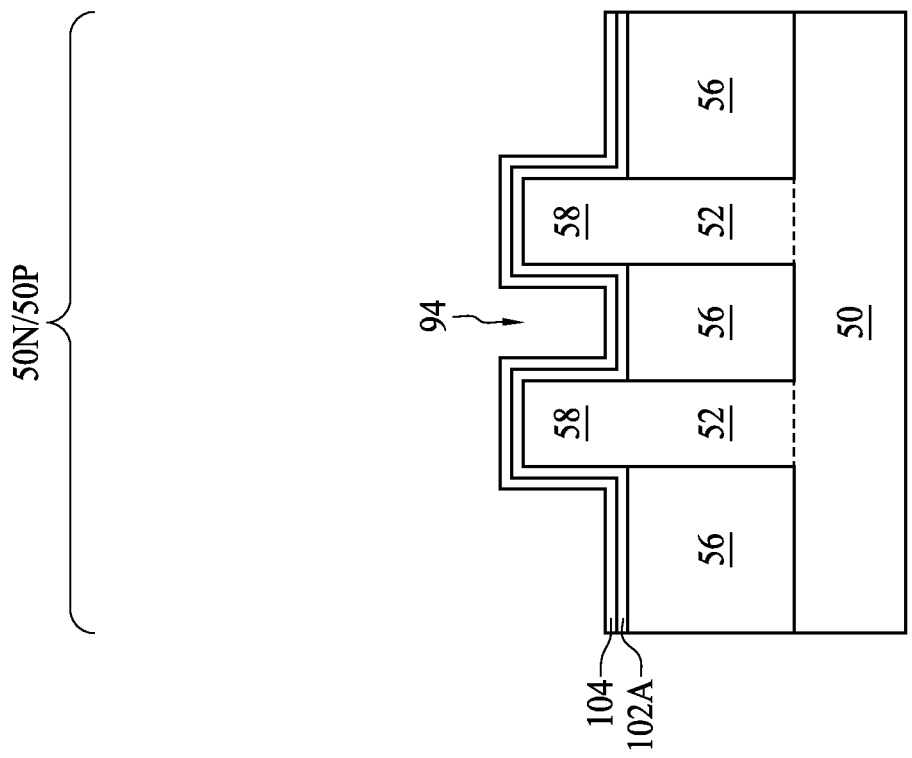
Figure 14A:
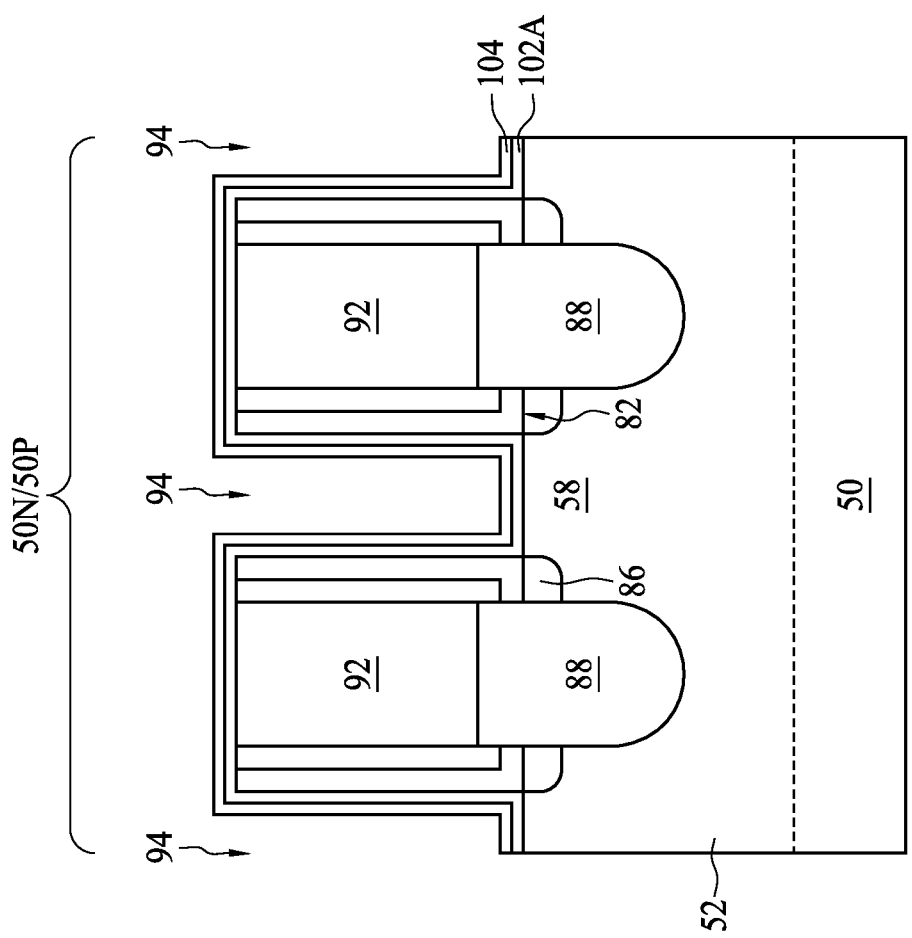

In FIGS. 14A and 14B, a dipole doping layer 104 is formed over the first gate dielectric layer 102A. The dipole doping layer 104 may be formed of an oxide, nitride, or carbide of a dipole-inducing element such as lanthanum, aluminum, scandium, ruthenium, zirconium, erbium, magnesium, strontium, or the like. The dipole doping layer 104 may be formed by PVD, CVD, ALD, or other suitable deposition methods. In some embodiments, the dipole doping layer 104 is formed of an oxide of lanthanum, e.g., $LaO_x$. After the dipole doping layer 104 is formed, an annealing process is performed to drive the dipole-inducing element of the dipole doping layer 104 into the first gate dielectric layer 102A. Once the anneal is complete, the first gate dielectric layer 102A is doped with the dipole-inducing element (e.g., lanthanum) of the dipole doping layer 104.

Although the dipole doping layer 104 is illustrated as a single layer, some embodiments may utilize multiple layers. In some embodiments, a first dipole doping layer 104 is formed in a first region (e.g., the n-type region 50N) and a second dipole doping layer 104 is formed in a second region (e.g., the p-type region 50P). The dipole doping layers 104 in the n-type region 50N and the p-type region 50P may have different thicknesses and/or be formed of different dipole-inducing elements. The thicknesses and materials of the dipole doping layers can be varied based on the desired threshold voltages of the FinFETs.

In the embodiments with different dipole doping layers, the different layers may be formed using a photoresist and/or other masks (not shown). For example, a photoresist may be formed over the first gate dielectric layer 102A in the n-type region 50N. The photoresist is patterned to expose the first gate dielectric layer 102A in the p-type region 50P. The photoresist can be formed by using a spin-on technique and can be patterned using acceptable photolithography techniques. Once the photoresist is patterned, a first dipole doping layer is deposited on the p-type region 50P, and the photoresist may act as a mask to substantially prevent the first dipole doping layer from being deposited on the n-type region 50N. After the deposition, the photoresist is removed, such as by an acceptable ashing process.

Following the deposition of the first dipole doping layer in the p-type region 50P, a photoresist is formed over the first gate dielectric layer 102A in the p-type region 50P. The photoresist is patterned to expose the first gate dielectric layer 102A in the n-type region 50N. The photoresist can be formed by using a spin-on technique and can be patterned using acceptable photolithography techniques. Once the photoresist is patterned, a second dipole doping layer is deposited on the n-type region 50N, and the photoresist may act as a mask to substantially prevent the second dipole doping layer from being deposited on the p-type region 50P. After the deposition, the photoresist may be removed, such as by an acceptable ashing process.

In FIGS. 15A and 15B, the excess portions of the dipole doping layer 104 are removed. The removal may be by an acceptable etching process, such as a wet etch that is selective to the material of the dipole doping layer 104. In some embodiment, the etching process is a wet etch using dilute hydrochloric acid, hydrochloric acid and hydrogen peroxide in deionized water, or dilute hydrochloric acid and ammonium hydroxide. The etching process may be performed at a temperature in the range of about 25° C. to about 180° C., and for a duration in the range of about 1 minutes to about 10 minutes.

After removal of the dipole doping layer 104, a second gate dielectric layer 102B is deposited on the first gate dielectric layer 102A. The second gate dielectric layer 102B may be formed of materials that are selected from the same group of candidate materials of the first gate dielectric layer 102A, which may be formed using methods that are selected from the same group of candidate methods for forming the materials of the first gate dielectric layer 102A. In some embodiments, the first gate dielectric layer 102A includes an interfacial layer of silicon oxide and a first layer of high-k dielectric material (e.g., hafnium oxide), while the second gate dielectric layer 102B includes a second layer of the high-k dielectric material (e.g., hafnium oxide). The first gate dielectric layer 102A and the second gate dielectric layer 102B collectively define a gate dielectric layer 102.

The process described with respect to FIGS. 12A through 15B is just one example of how the gate dielectric layer 102 may be formed and doped with a dipole-inducing element. Other techniques may be used to form doped gate dielectric layers. For example, a dipole-inducing element may first be formed in the recesses 94 by other means, the gate dielectric layer may then be deposited over the dipole-inducing element, and an anneal may be performed. Likewise, both the first gate dielectric layer 102A and the second gate dielectric layer 102B may be deposited before they are doped with the dipole-inducing element.

Figure 15C:
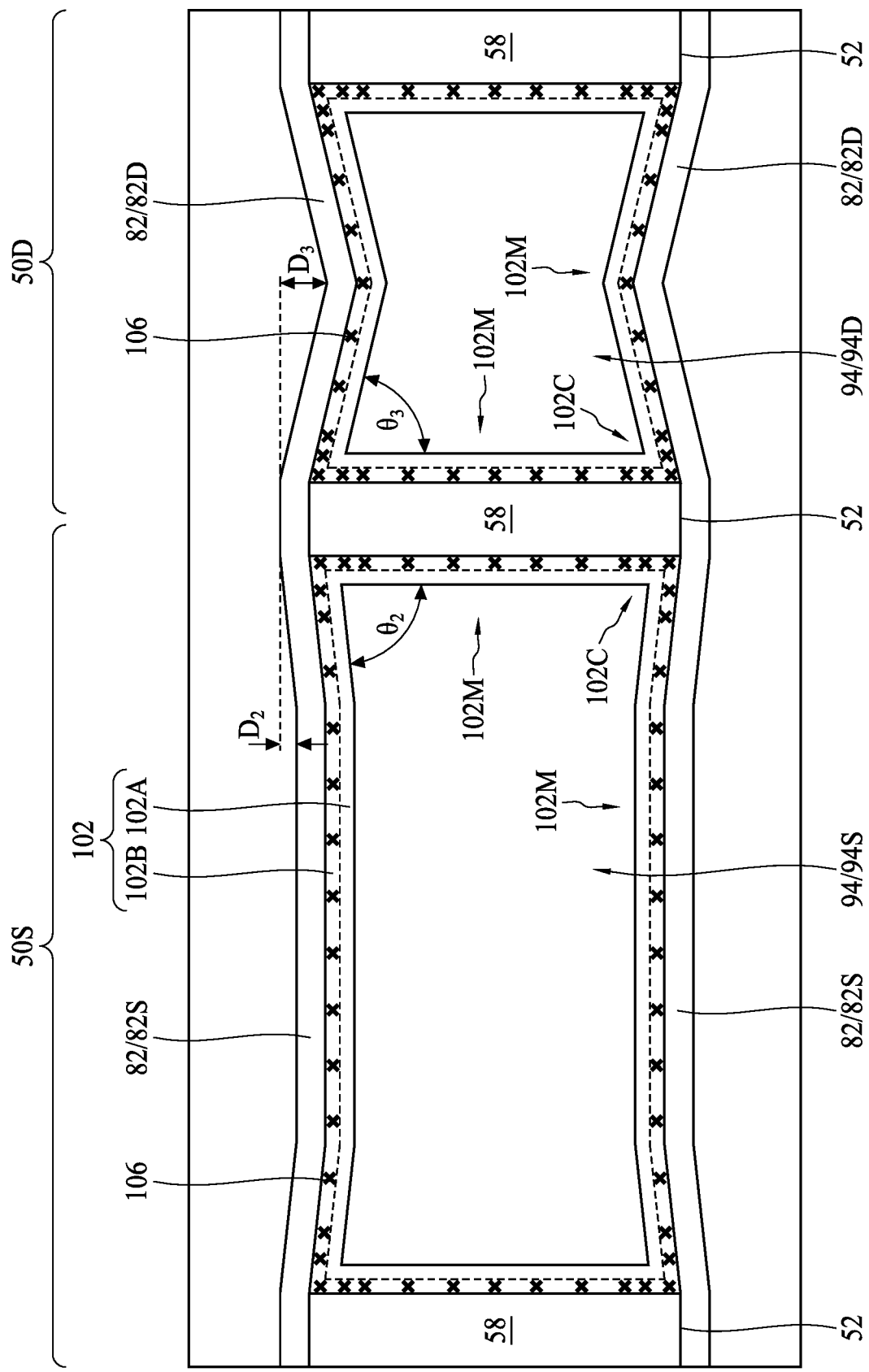

Referring to FIG. 15C, the profile shape of the gate dielectric layer 102 in a top-down view is shown. FIG. 15C is illustrated along reference cross-section C-C in FIG. 4, so as to more specifically illustrate features of the gate dielectric layer 102 between the fins 52. As discussed above, the spacer treatment process 96 helps decrease the angles $\theta_2$, $\theta_3$ of the corners $94S_C$, $94D_C$. Decreasing the angles $\theta_2$, $\theta_3$ advantageously allows the gate dielectric layer 102 (e.g., the first gate dielectric layer 102A and the second gate dielectric layer 102B) to be more fully deposited in the corners $94S_C$, $94D_C$. The formations of gaps or voids around the replacement gates (e.g., voids in the corners $94S_C$, $94D_C$) may be avoided. The gate resistance ($R_g$) of the replacement gates may thus be decreased, improving performance of the FinFETs.

As a result of the process for doping the gate dielectric layer 102, impurities 106 (e.g., the dipole-inducing element) remain in the gate dielectric layer 102. However, the second gate dielectric layer 102B may not be doped in the same manner as the first gate dielectric layer 102A. In such embodiments, the first gate dielectric layer 102A includes the impurities 106, while the second gate dielectric layer 102B is substantially free from the impurities 106.

Because the gate dielectric layer 102 is conformally deposited, it inherits the underlying shape of the recesses 94. Thus, the gate dielectric layer 102 has corner portions 102C in the corners 94$S_C$, 94$D_C$ (see FIG. 11C) of the recesses 94, and has middle portions 102M extending along the sidewalls of the recesses 94 (e.g., the sidewalls of the gate spacers 82 and the sidewalls of the fins 52). The sidewalls of the middle portions 102M form acute angles, e.g., the angles $\theta_2$, $\theta_3$. The middle portions 102M of the gate dielectric layer 102 that extend along the gate spacers 82 (or more generally, a first direction) have the same bowed profile shape as the gate spacers 82. The middle portions 102M of the gate dielectric layer 102 that extend along the fins 52 (or more generally, a second direction that is perpendicular to the first direction) are straight and do not have a bowed profile shape.

As discussed above, the spacer treatment process 96 helps decrease the angles $\theta_2$, $\theta_3$. Decreasing the angles $\theta_2$, $\theta_3$ advantageously allows more impurities 106 to be formed in the corner portions 102C than the middle portions 102M of the gate dielectric layer 102. For example, because of crowding, the process for removing the dipole doping layer 104 may leave more residual dipole-inducing element in the corners 94$S_C$, 94$D_C$ than in other regions of the recesses 94. Thus, the corner portions 102C of the gate dielectric layer 102 have a greater concentration of the impurities than the middle portions 102M of the gate dielectric layer 102. The work function of the replacement gates may thus be different at the centers and the edges of the channel regions 58, allowing for more uniform turning on of the channel regions 58. The amount of impurities 106 in the corner portions 102C of the gate dielectric layer 102 may be controlled by controlling the parameters (e.g., duration) of the etching process used to remove the dipole doping layer 104 based on the desired threshold voltages of the FinFETs. In some embodiments, the concentration of the impurities 106 in the corner portions 102C of the gate dielectric layer 102 is from about 1 to about 2.5 times the concentration of the impurities 106 in the middle portions 102M of the gate dielectric layer 102. For example, the impurities 106 in the corner portions 102C of the gate dielectric layer 102 can have a concentration in the range of about $0.06 \times 10^{15}$ to about $800 \times 10^{18}$ atoms/cm$^2$, and the impurities 106 in the middle portions 102M of the gate dielectric layer 102 can have a concentration in the range of about 0 to about $60 \times 10^{16}$ atoms/cm$^2$.

Figure 16B:
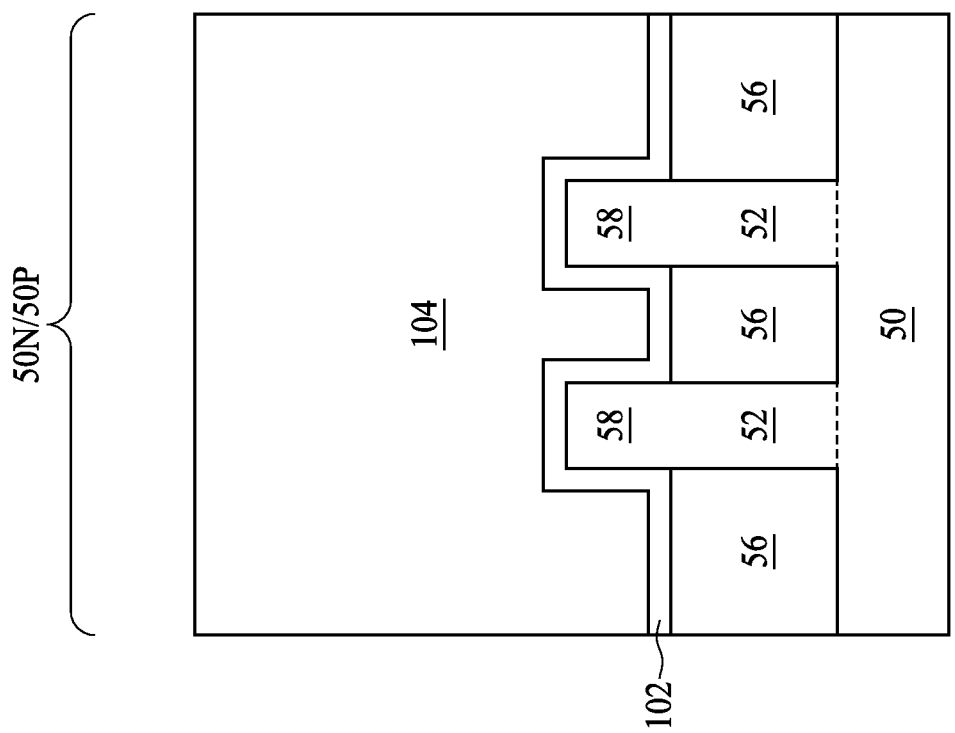
Figure 16A:
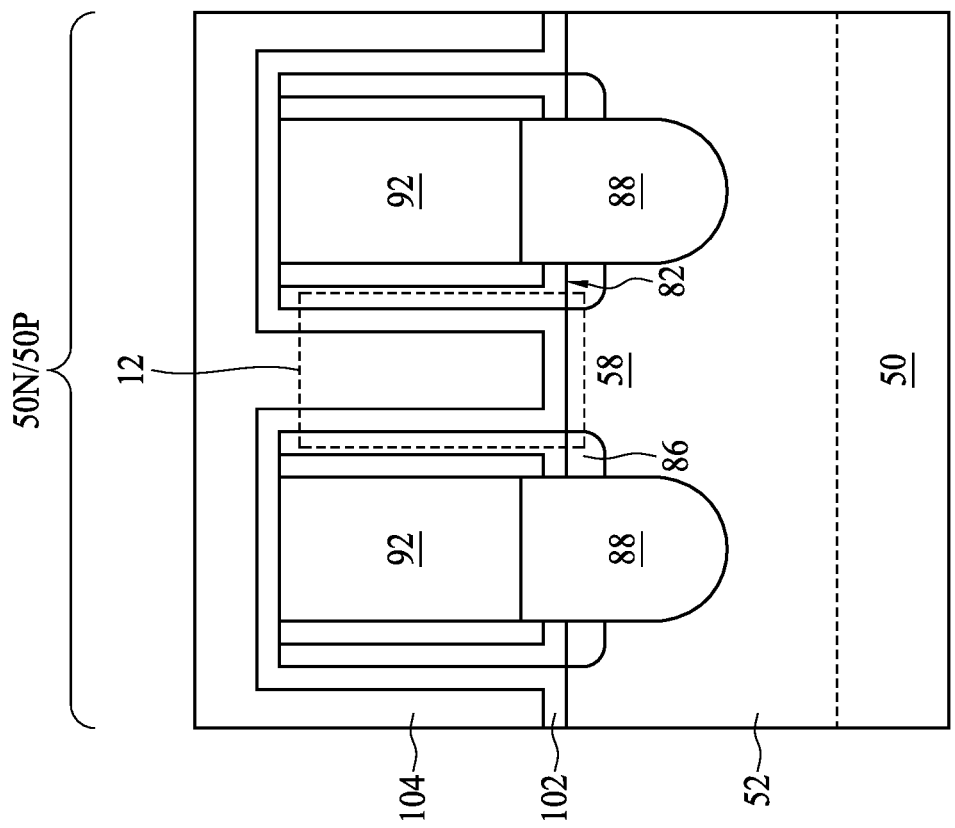
Figure 16C:
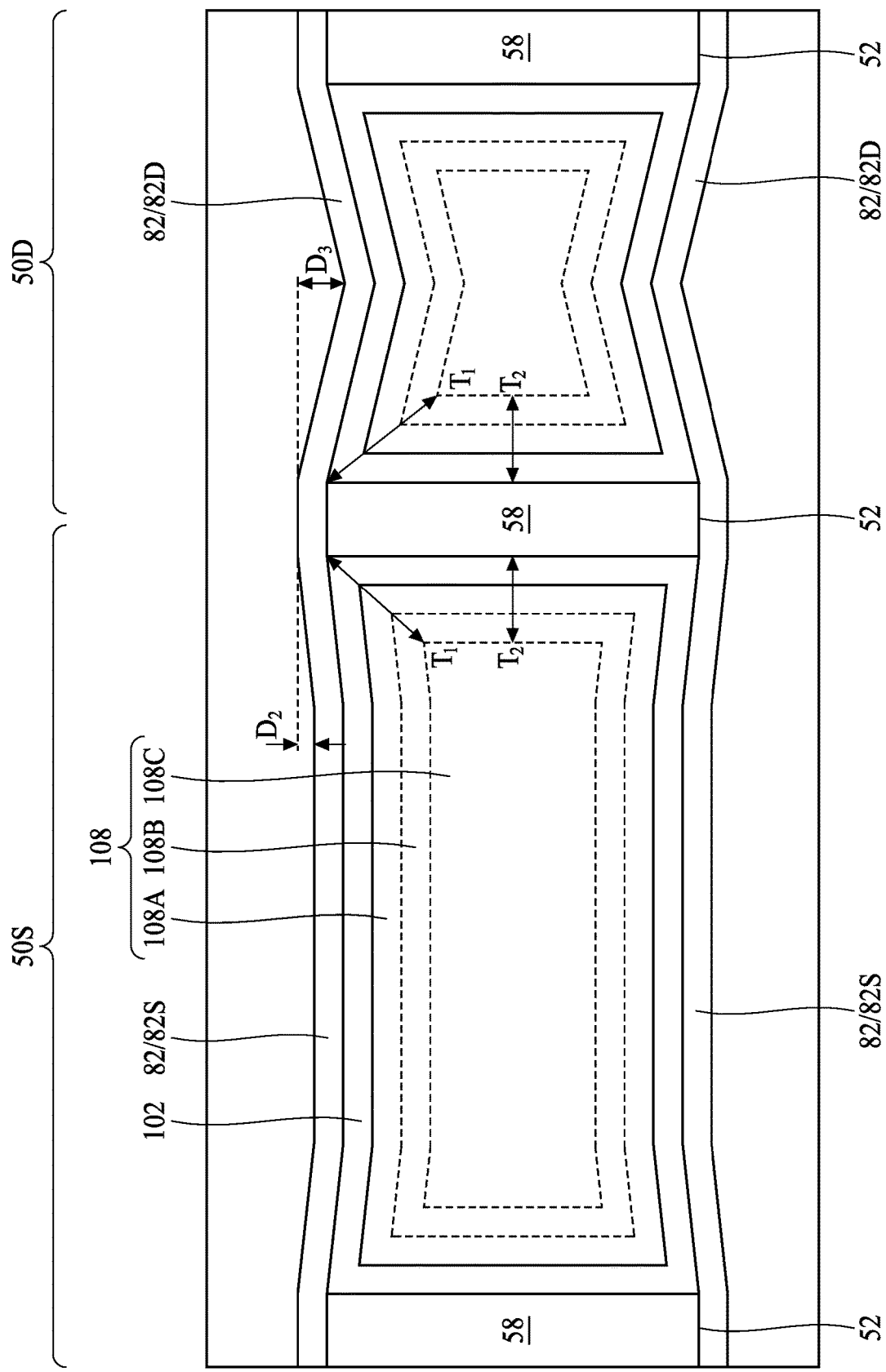
Figure 16D:
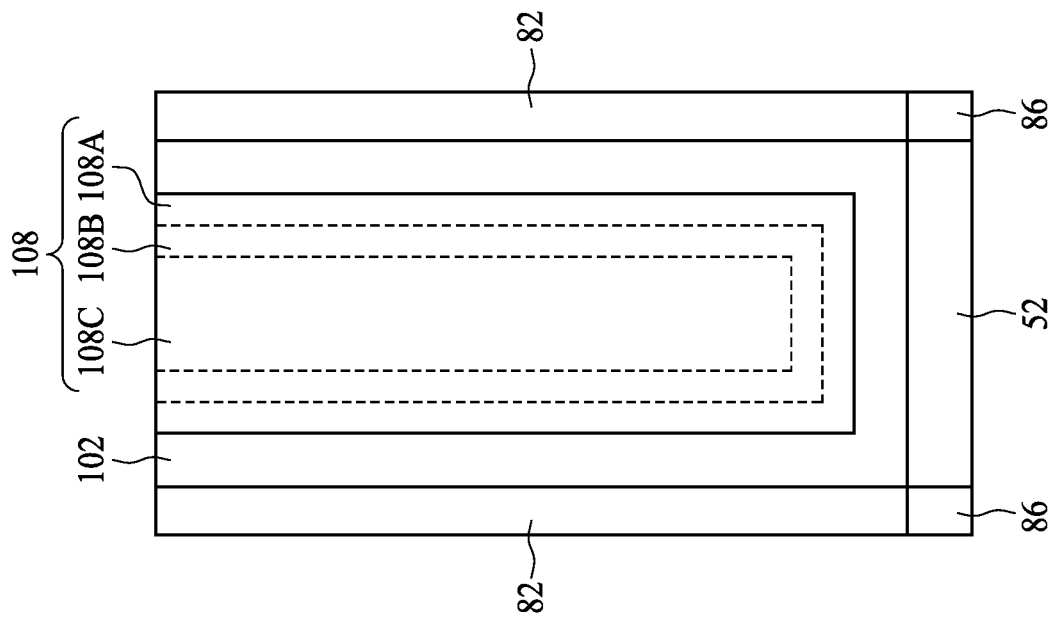

In FIGS. 16A and 16B, a gate electrode layer 108 is deposited over the gate dielectric layer 102, and fill the remaining portions of the recesses 94. FIG. 16D illustrates a detailed view of region 12 of FIG. 16A. The gate electrode layer 108 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 108 is illustrated in FIGS. 16A and 16B, the gate electrode layer 108 may comprise any number of liner layers 108A, any number of work function tuning layers 108B, and a fill material 108C as illustrated by FIGS. 16C and 16D.

The liner layers 108A (sometimes referred to as capping layers) include any acceptable material to promote adhesion and prevent diffusion. For example, the liner layers 108A may be formed of a metal or metal nitride such as titanium nitride, titanium aluminide, titanium aluminum nitride, silicon-doped titanium nitride (TiSiN), tantalum nitride, or the like, which may be deposited by ALD, CVD, PVD, or the like. In some embodiments, one or more of the liner layers 108A may be deposited, removed (e.g., by etching), and redeposited, which helps remove residual dipole-inducing elements (e.g., lanthanum) that may remain on the top surface of the gate dielectric layer 102.

The work function tuning layers 108B include any acceptable material to tune a work function of a device to a desired amount given the application of the device to be formed, and may be deposited using any acceptable deposition process. For example, the work function tuning layers 108B may be formed of aluminum, aluminum nitride, titanium aluminide, tantalum aluminum, titanium carbon nitride, or the like, which may be deposited by ALD, CVD, PVD, or the like. In some embodiments, a first work function tuning layer is formed in a first region (e.g., the p-type region 50P) and a second work function tuning layer is formed in a second region (e.g., the n-type region 50N). As an example to form the work function tuning layers 108B, a first work function tuning layer may be deposited in both the p-type region 50P and the n-type region 50N. The first work function tuning layer may be removed (e.g., by etching) from the n-type region 50N, and a second work function tuning layer may then be deposited in both the p-type region 50P and the n-type region 50N. Thus, the p-type region 50P may contain both a first work function tuning layer and a second work function tuning layer, while the n-type region 50N contains the second work function tuning layer but not the first work function tuning layer. Various work function tuning layers may be formed based on the desired threshold voltages of the FinFETs.

The fill material 108C includes any acceptable material of a low resistance. For example, the fill material 108C may be formed of a metal such as tungsten (W), aluminum (Al), cobalt (Co), ruthenium (Ru), combinations thereof or the like, which may be deposited by ALD, CVD, PVD, or the like. In some embodiments, an adhesion or glue layer is formed between the fill material 108C and the work function tuning layers 108B. The fill material 108C fills the remaining portions of the recesses 94.

Referring to FIG. 16C, the profile shape of the gate electrode layer 108 in a top-down view is shown. FIG. 16C is illustrated along reference cross-section C-C in FIG. 4, so as to more specifically illustrate features of the gate electrode layer 108 between the fins 52.

Because the liner layers 108A and the work function tuning layers 108B are conformally deposited, they inherit the underlying shape of the recesses 94. Thus, similar to the gate dielectric layer 102, the liner layers 108A and the work function tuning layers 108B also have corner portions in the corners 94$S_C$, 94$D_C$ (see FIG. 11C) of the recesses 94, and have middle portions extending along the sidewalls of the recesses 94. The corner portions and the middle portions of the liner layers 108A and the work function tuning layers 108B laterally surround the fill material 108C. The middle portions of the liner layers 108A and the work function tuning layers 108B also have the same bowed profile shape as the gate spacers 82.

As discussed above, the spacer treatment process 96 helps decrease the angles $\theta_2$, $\theta_3$ of the corners 94$S_C$, 94$D_C$ (see FIG. 11C). Decreasing the angles $\theta_2$, $\theta_3$ advantageously allows the corner portions of the gate dielectric layer 102, the liner layers 108A, and the work function tuning layers 108B to be formed to larger thicknesses. Specifically, the thickness $T_1$ of the corner portions of the gate dielectric layer 102, the liner layers 108A, and the work function tuning layers 108B is greater than the thickness $T_2$ of the middle portions of the gate dielectric layer 102, the liner layers 108A, and the work function tuning layers 108B. In some embodiments, the thickness $T_1$ is from about 1.2 to about 1.6 times the thickness $T_2$. The work function of the replacement gates may thus be different at the centers and the edges of the channel regions 58, allowing for more uniform turning on of the channel regions 58.

In the illustrated embodiment, the corner portions in the sparse regions 50S have the same thickness $T_1$ as the corner portions in the dense regions 50D, and the middle portions in the sparse regions 50S have the same thickness $T_2$ as the middle portions in the dense regions 50D. In another embodiment, the corner portions in the sparse regions 50S have a different thickness than the corner portions in the dense regions 50D, and the middle portions in the sparse regions 50S have a different thickness than the middle portions in the dense regions 50D.

Figure 17B:
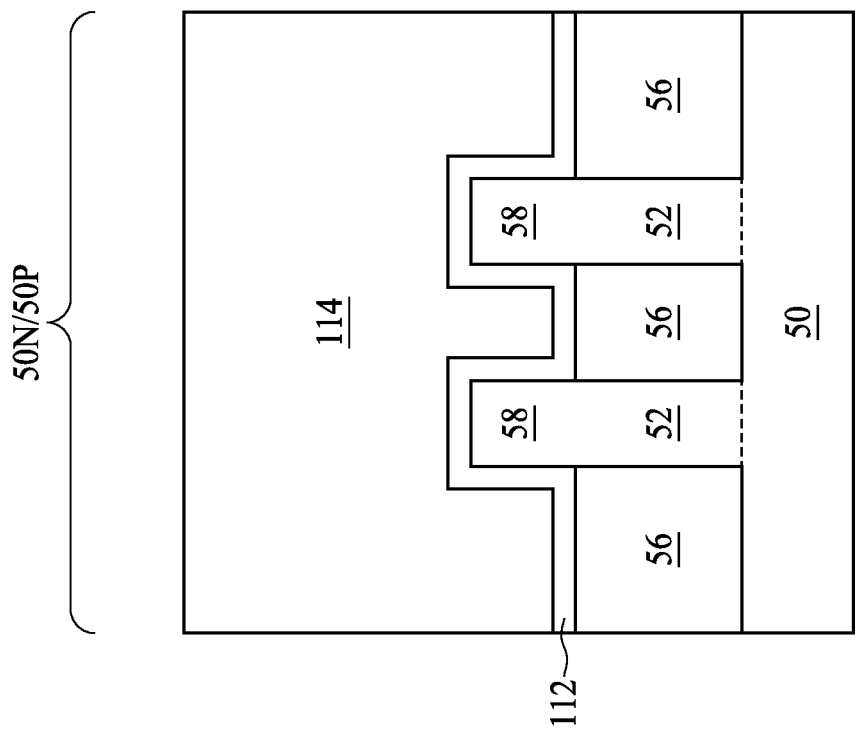
Figure 17A:
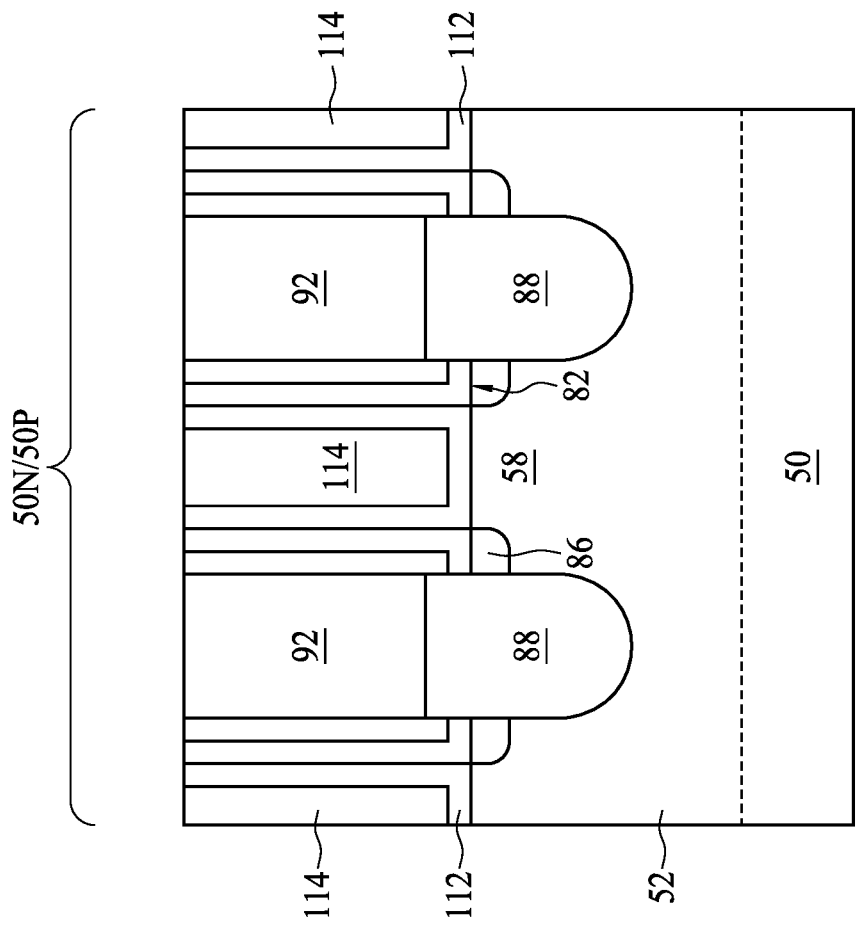

In FIGS. 17A and 17B, a planarization process, such as a CMP, is performed to remove the excess portions of the gate dielectric layer 102 and the gate electrode layer 108, which excess portions are over the top surfaces of the first ILD 92. The remaining portions of the gate dielectric layer 102 in the recesses 94 form gate dielectrics 112. The remaining portions of the gate electrode layer 108 in the recesses 94 form gate electrodes 114. The gate dielectrics 112 and the gate electrodes 114 form replacement gates of the FinFETs. The gate dielectrics 112 and the gate electrodes 114 may each be collectively referred to as a "gate structure." The gate structures extend along sidewalls of a channel region 58 of the fins 52.

Figure 18B:
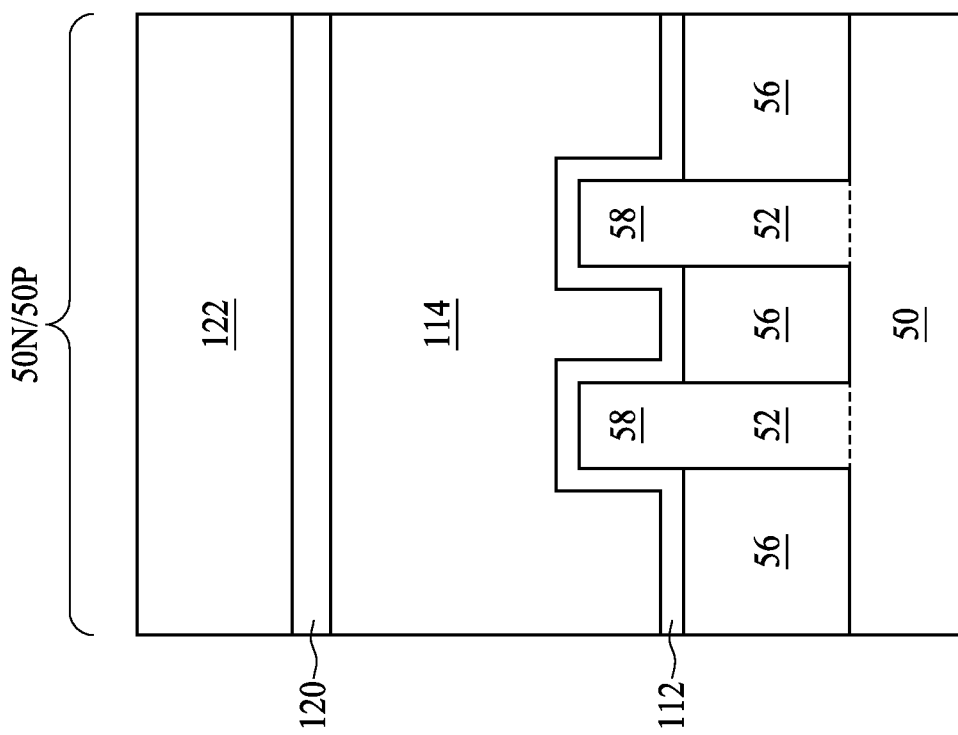
Figure 18A:
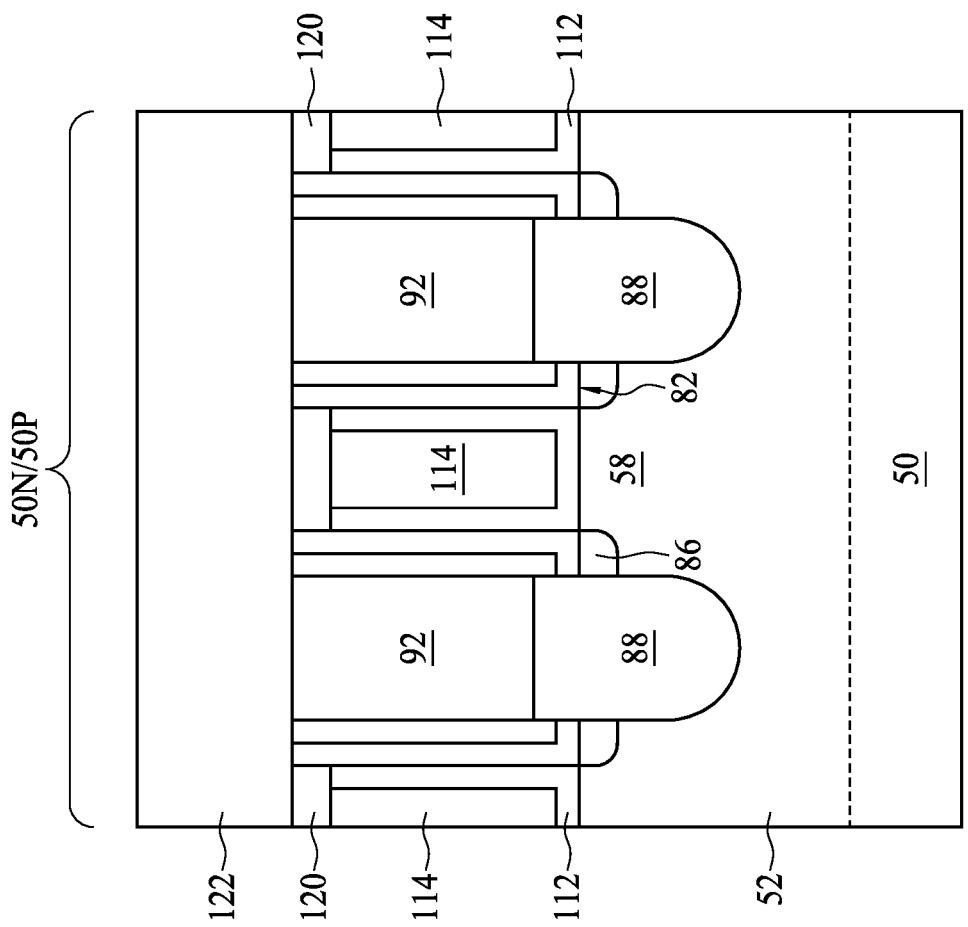

In FIGS. 18A and 18B, a second ILD 122 is deposited over the gate spacers 82, the first ILD 92, and the gate dielectrics 112, and the gate electrodes 114. In some embodiments, the second ILD 122 is a flowable film formed by a flowable CVD method. In some embodiments, the second ILD 122 is formed of a dielectric material such as PSG, BSG, BPSG, USG, or the like, and may be deposited by any suitable method, such as CVD and PECVD.

Optionally, gate masks 120 are formed over the gate structures (including the gate dielectrics 112 and the corresponding gate electrodes 114) before formation of the second ILD 122. The gate masks 120 are disposed between opposing portions of the gate spacers 82. In some embodiments, forming the gate masks 120 includes recessing the gate structures so that recesses are formed directly over the gate structures and between opposing portions of gate spacers 82. One or more layers of dielectric material, such as silicon nitride, silicon oxynitride, or the like, are filled in the recesses, followed by a planarization process to remove excess portions of the dielectric material extending over the first ILD 92. The gate masks 120 include the portions of the dielectric material remaining in the recesses. Subsequently formed gate contacts will penetrate through the gate masks 120 and the second ILD 122 to contact the top surfaces of the recessed gate electrodes 114.

Figure 19B:
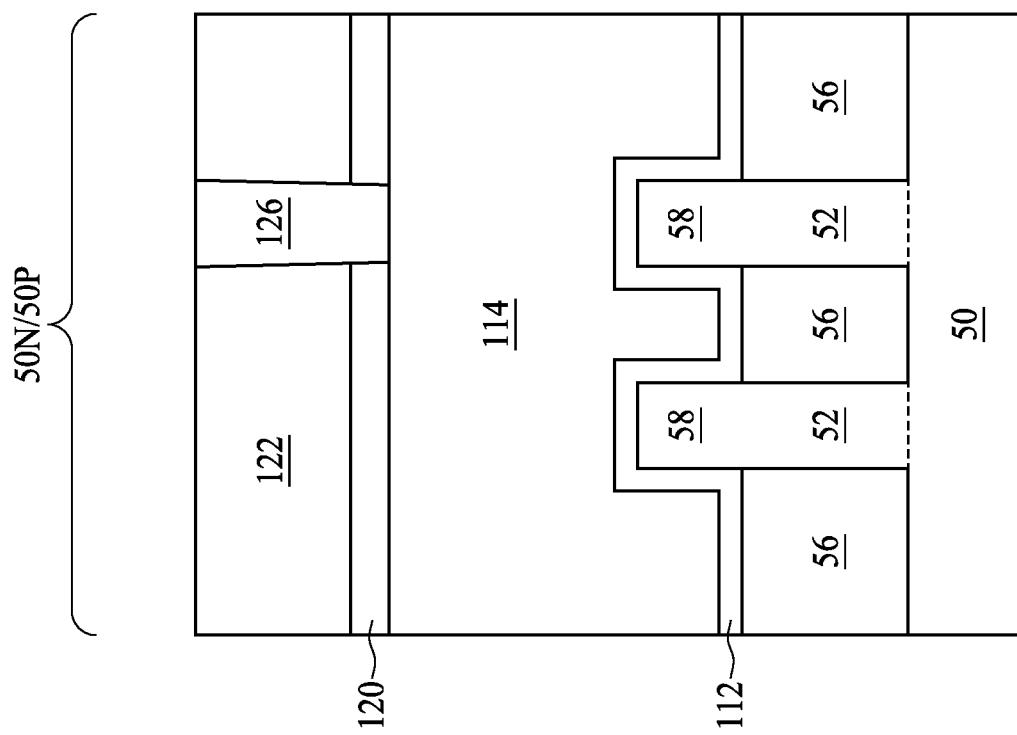
Figure 19A:
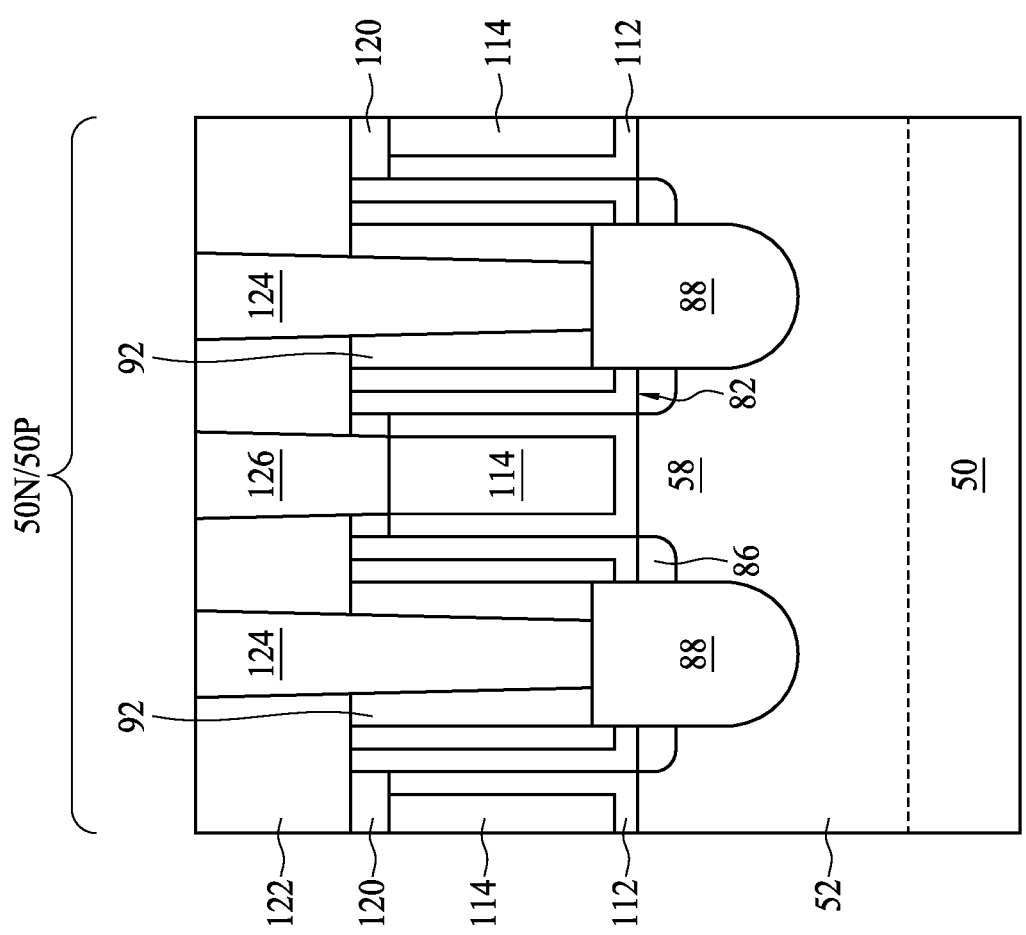

In FIGS. 19A and 19B, source/drain contacts 124 and gate contacts 126 are formed to contact, respectively, the epitaxial source/drain regions 88 and the gate electrodes 114. Openings for the source/drain contacts 124 are formed through the first ILD 92 and the second ILD 122, and openings for the gate contacts 126 are formed through the gate masks 120 and the second ILD 122. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 122. The remaining liner and conductive material form the source/drain contacts 124 and the gate contacts 126 in the openings. An anneal process may be performed to form a silicide at the interface between the epitaxial source/drain regions 88 and the source/drain contacts 124. The source/drain contacts 124 are physically and electrically coupled to the epitaxial source/drain regions 88, and the gate contacts 126 are physically and electrically coupled to the gate electrodes 114. The source/drain contacts 124 and the gate contacts 126 may be formed in different processes, or may be formed in the same process. Although shown as being formed in the same cross-sections, it should be appreciated that each of the source/drain contacts 124 and the gate contacts 126 may be formed in different cross-sections, which may avoid shorting of the contacts.

Embodiments may achieve advantages. Recessing the dummy gates 74 (as discussed above for FIGS. 10A and 10B) and then performing the spacer treatment process 96 (as discussed above for FIGS. 11A and 11B) helps increase the bowing of the gate spacers 82. The angles $\theta_2$, $\theta_3$ of the corners $94S_C$, $94D_C$ of the recesses 94 (see FIG. 11C) may thus be decreased, which may allow the gate dielectric layer 102 to be more fully deposited in the corners $94S_C$, $94D_C$. The formations of gaps or voids around the replacement gates (e.g., voids in the corners $94S_C$, $94D_C$) may be avoided. The gate resistance ($R_g$) of the replacement gates may thus be decreased, improving performance of the FinFETs.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In an embodiment, a device includes: a first fin extending from a substrate; a second fin extending from the substrate; a gate spacer over the first fin and the second fin; a gate dielectric having a first portion, a second portion, and a third portion, the first portion extending along a first sidewall of the first fin, the second portion extending along a second sidewall of the second fin, the third portion extending along a third sidewall of the gate spacer, the third portion and the first portion forming a first acute angle, the third portion and the second portion forming a second acute angle; and a gate electrode on the gate dielectric.

In some embodiments of the device, the first fin and the second fin extend along a first direction, and the gate spacer extends along a second direction, the first portion and the second portion of the gate dielectric being straight along the first direction, the third portion of the gate dielectric being bowed along the second direction. In some embodiments of the device, the gate dielectric has a fourth portion and a fifth portion, the fourth portion extending along the third sidewall of the gate spacer, the fifth portion extending along a fifth sidewall of the first fin, the fifth sidewall opposite the first sidewall, the fourth portion and the fifth portion forming a third acute angle, the third acute angle being greater than the first acute angle and the second acute angle. In some embodiments of the device, the first acute angle and the second acute angle are in a range of 45 degrees to 85 degrees, and the third acute angle is in a range of 65 degrees to 85 degrees. In some embodiments, the device further includes: a third fin extending from the substrate, where a first portion of the gate spacer is disposed between the first fin and the second fin, and a second portion of the gate spacer is disposed between the first fin and the third fin, the first portion of the gate spacer bowing inward a first distance, the second portion of the gate spacer bowing inward a second distance, the second distance less than the first distance. In some embodiments of the device, the first fin and the second fin are separated by a third distance, and the first fin and the third fin are separated by a fourth distance, the fourth distance greater than the third distance.

In an embodiment, a device includes: a first fin extending from a substrate; a first gate spacer over the first fin; a second gate spacer over the first fin; a gate dielectric between the first gate spacer and the second gate spacer, the gate dielectric including a dielectric material doped with a dipole-inducing element, the gate dielectric having a first corner portion, a second corner portion, and a middle portion, the first corner portion adjacent the first gate spacer, the second corner portion adjacent the second gate spacer, the middle portion extending along the first fin between the first corner portion and the second corner portion, the first corner portion and the second corner portion having a first concentration of the dipole-inducing element, the middle portion having a second concentration of the dipole-inducing element, the second concentration being less than the first concentration; and a gate electrode on the gate dielectric.

In some embodiments of the device, the first corner portion and the second corner portion have a first thickness, and the middle portion has a second thickness, the second thickness being less than the first thickness. In some embodiments of the device, a ratio of the first thickness to the second thickness is in a range of 1.2 to 1.6. In some embodiments of the device, the gate electrode includes a work function tuning layer on the gate dielectric, the work function tuning layer having a first thickness adjacent the first corner portion and the second corner portion, the work function tuning layer having a second thickness adjacent the middle portion, the second thickness being less than the first thickness. In some embodiments of the device, a ratio of the first concentration to the second concentration is in a range of 1 to 2.5. In some embodiments of the device, the dielectric material is hafnium oxide and the dipole-inducing element is lanthanum. In some embodiments of the device, the first corner portion and the second corner portion are each disposed in a respective corner having an acute angle. In some embodiments of the device, the acute angle is in a range of 45 degrees to 85 degrees.

In an embodiment, a method includes: forming a dummy gate over a channel region of a fin; forming gate spacers adjacent the dummy gate; recessing the dummy gate to expose sidewalls of the gate spacers; performing a spacer treatment process, the spacer treatment process bowing the sidewalls of the gate spacers towards one another; removing remaining portions of the dummy gate to expose the channel region; and forming a gate dielectric on the channel region and the sidewalls of the gate spacers.

In some embodiments of the method, the spacer treatment process includes an ammonia soak process. In some embodiments of the method, the spacer treatment process includes a nitrogen radical treatment process. In some embodiments of the method, the spacer treatment process includes a low-temperature anneal process. In some embodiments of the method, the sidewalls of the gate spacers form corners with sidewalls of the fin, the corners having angles, the spacer treatment process decreasing the angles of the corners. In some embodiments of the method, forming the gate dielectric includes: depositing first gate dielectric layer on the channel region and the sidewalls of the gate spacers; depositing a doping layer on the first gate dielectric layer; annealing the doping layer to drive a dopant from the doping layer into the first gate dielectric layer; removing the doping layer, where residue of the dopant remains in the corners; and depositing a second gate dielectric layer on the first gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first fin extending from a substrate;
a second fin extending from the substrate;
a gate spacer over the first fin and the second fin;
a gate dielectric having a first portion, a second portion, and a third portion, the first portion extending along a first sidewall of the first fin, the second portion extending along a second sidewall of the second fin, the third portion extending along a third sidewall of the gate spacer, the third portion and the first portion forming a first acute angle where the third portion and the first portion meet, the third portion and the second portion forming a second acute angle where the third portion and the second portion meet; and
a gate electrode on the gate dielectric.

2. The device of claim 1, wherein the first fin and the second fin extend along a first direction, and the gate spacer extends along a second direction, the first portion and the second portion of the gate dielectric being straight along the first direction, the third portion of the gate dielectric being bowed along the second direction.

3. The device of claim 1, wherein the gate dielectric has a fourth portion and a fifth portion, the fourth portion extending along the third sidewall of the gate spacer, the fifth portion extending along a fifth sidewall of the first fin, the fifth sidewall opposite the first sidewall, the fourth portion and the fifth portion forming a third acute angle, the third acute angle being greater than the first acute angle and the second acute angle.

4. The device of claim 3, wherein the first acute angle and the second acute angle are in a range of 45 degrees to 85 degrees, and the third acute angle is in a range of 65 degrees to 85 degrees.

5. The device of claim 3 further comprising:
a third fin extending from the substrate, wherein a first portion of the gate spacer is disposed between the first fin and the second fin, and a second portion of the gate spacer is disposed between the first fin and the third fin, the first portion of the gate spacer bowing inward a first distance, the second portion of the gate spacer bowing inward a second distance, the second distance less than the first distance.

6. The device of claim 5, wherein the first fin and the second fin are separated by a third distance, and the first fin and the third fin are separated by a fourth distance, the fourth distance greater than the third distance.

7. A device comprising:
a first fin extending from a substrate;
a first gate spacer over the first fin;
a second gate spacer over the first fin;
a gate dielectric between the first gate spacer and the second gate spacer, the gate dielectric comprising a dielectric material doped with a dipole-inducing element, the gate dielectric having a first corner portion, a second corner portion, and a middle portion, the first corner portion adjacent the first gate spacer, the second corner portion adjacent the second gate spacer, the middle portion extending along the first fin between the first corner portion and the second corner portion, the first corner portion and the second corner portion having a first concentration of the dipole-inducing element, the middle portion having a second concentration of the dipole-inducing element, the second concentration being less than the first concentration; and
a gate electrode on the gate dielectric.

8. The device of claim 7, wherein the first corner portion and the second corner portion have a first thickness, and the middle portion has a second thickness, the second thickness being less than the first thickness.

9. The device of claim 8, wherein a ratio of the first thickness to the second thickness is in a range of 1.2 to 1.6.

10. The device of claim 7, wherein the gate electrode comprises a work function tuning layer on the gate dielectric, the work function tuning layer having a first thickness adjacent the first corner portion and the second corner portion, the work function tuning layer having a second thickness adjacent the middle portion, the second thickness being less than the first thickness.

11. The device of claim 7, wherein a ratio of the first concentration to the second concentration is in a range of 1 to 2.5.

12. The device of claim 7, wherein the dielectric material is hafnium oxide and the dipole-inducing element is lanthanum.

13. The device of claim 7, wherein the first corner portion and the second corner portion are each disposed in a respective corner having an acute angle.

14. The device of claim 13, wherein the acute angle is in a range of 45 degrees to 85 degrees.

15. A device comprising:
an isolation region;
a first fin protruding above the isolation region;
a gate structure on a first sidewall of the first fin, a second sidewall of the first fin, and a top surface of the isolation region, the first sidewall of the first fin being opposite the second sidewall of the first fin; and
a gate spacer adjacent the gate structure, a sidewall of the gate spacer forming a first acute angle with the first sidewall of the first fin in a top-down view, the sidewall of the gate spacer forming a second acute angle with the second sidewall of the first fin in the top-down view.

16. The device of claim 15, wherein the gate structure comprises a gate dielectric, the gate dielectric comprising a dielectric material doped with a dipole-inducing element.

17. The device of claim 16, wherein the gate dielectric has a first portion proximate the gate spacer and has a second portion distal the gate spacer, the first portion having a first concentration of the dipole-inducing element, the second portion having a second concentration of the dipole-inducing element, the second concentration being less than the first concentration.

18. The device of claim 15, wherein the gate structure comprises a gate dielectric, the gate dielectric has a first portion proximate the gate spacer and has a second portion distal the gate spacer, the first portion has a first thickness, the second portion has a second thickness, and the second thickness is less than the first thickness.

19. The device of claim 15, further comprising:
a second fin protruding above the isolation region, the gate structure disposed on a third sidewall of the second fin, the sidewall of the gate spacer forming the first acute angle with the third sidewall of the second fin in the top-down view.

20. The device of claim 15, wherein the first acute angle is greater than the second acute angle.

* * * * *